United States Patent
Tanaka et al.

(10) Patent No.: US 7,346,273 B2
(45) Date of Patent: Mar. 18, 2008

(54) SUBSTRATE PROCESSING EQUIPMENT

(75) Inventors: Kazuo Tanaka, Tokyo (JP); Masaaki Ueno, Tokyo (JP); Masashi Sugishita, Tokyo (JP)

(73) Assignee: Hitachi Kokusai Electric Inc, Tokyo (JP)

( * ) Notice: Subject to any disclaimer, the term of this patent is extended or adjusted under 35 U.S.C. 154(b) by 12 days.

(21) Appl. No.: 10/550,202

(22) PCT Filed: Jun. 18, 2004

(86) PCT No.: PCT/JP2004/008603

§ 371 (c)(1),
(2), (4) Date: Oct. 20, 2005

(87) PCT Pub. No.: WO2005/010970

PCT Pub. Date: Feb. 3, 2005

(65) Prior Publication Data

US 2006/0188240 A1   Aug. 24, 2006

(30) Foreign Application Priority Data

Jul. 28, 2003 (JP) .............................. 2003-202433

(51) Int. Cl.
*F26B 3/30* (2006.01)
*H05B 3/02* (2006.01)

(52) U.S. Cl. ...................................... 392/418; 219/483

(58) Field of Classification Search ........ 392/416–418; 219/402–414, 483–495; 118/724, 725
See application file for complete search history.

(56) References Cited

U.S. PATENT DOCUMENTS 5,593,608 A * 1/1997 Suzuki ........................ 219/492
6,495,805 B2 * 12/2002 Sakamoto et al. ........... 219/483

FOREIGN PATENT DOCUMENTS

| JP | A 07-283158 | 10/1995 |
| JP | A 2002-091574 | 3/2002 |
| JP | A 2002-175123 | 6/2002 |

* cited by examiner

*Primary Examiner*—Sang Paik
(74) *Attorney, Agent, or Firm*—Oliff & Berridge, PLC

(57) ABSTRACT

It is an object of the invention to provide a substrate processing equipment that can predict a temperature of a substrate and easily control temperature of the substrate. Formed in a reactor (processing chamber) 3 are four temperature adjustment zones, of which setting and adjustment of temperature can be made by zone heaters 340-1 to 340-4. A temperature controller 4 mixes temperatures detected by inner thermocouples 302-1 to 302-4 and outer thermocouples 342-1 to 342-4 to calculate predicted temperatures of substrates by means of the first-order lag calculation on the basis of time constants of temperatures of substrates heated by the zone heaters 340-1 to 340-4. Also, the temperature controller 4 calculates electric power values (operating variables) for the zone heaters 340-1 to 340-4 with the use of predicted temperatures of substrates to output the same to the zone heaters 340-1 to 340-4.

6 Claims, 17 Drawing Sheets

|  | UPPER TEMPERATURE MONITOR | CENTRAL TEMPERATURE MONITOR | LOWER TEMPERATURE MONITOR |
|---|---|---|---|
| FLAT (WHEN STABLE) | 852.4 | 853.0 | 853.6 |
| U+5°C | 855.6 | 852.7 | 853.2 |
| CU+5°C | 854.0 | 854.4 | 852.9 |
| CL+5°C | 852.1 | 857.0 | 855.7 |
| L+5°C | 852.3 | 852.6 | 856.7 |

FIG. 12

| VARIATION | UPPER TEMPERATURE MONITOR | CENTRAL TEMPERATURE MONITOR | LOWER TEMPERATURE MONITOR |
|---|---|---|---|
| U | 3.2 | -0.3 | -0.4 |
| CU | 1.6 | 1.4 | -0.7 |
| CL | -0.3 | 4.0 | 2.1 |
| L | -0.1 | -0.4 | 3.1 |
| SUM OF VARIATIONS | 4.4 | 4.7 | 4.1 |

FIG. 13

| RATE OF VARIATION | UPPER TEMPERATURE MONITOR | CENTRAL TEMPERATURE MONITOR | LOWER TEMPERATURE MONITOR |
|---|---|---|---|
| U | 0.727 | -0.064 | -0.097 |
| CU | 0.364 | 0.298 | -0.171 |
| CL | -0.068 | 0.851 | 0.512 |
| L | -0.023 | -0.085 | 0.756 |
| SUM | 1.000 | 1.000 | 1.000 |

TEMPERATURE PREDICTION PARAMETERS
(T1=50, K1=1.074, T2=12S, K2=1.072, b=40, C=1.0)

FIG. 16

| | U | CU | CL | L |
|---|---|---|---|---|
| UPPER TEMPERATURE MONITOR | 0.640 | 0.320 | -0.060 | -0.020 |
| CENTRAL TEMPERATURE MONITOR | -0.060 | 0.280 | 0.800 | -0.080 |
| LOWER TEMPERATURE MONITOR | -0.080 | -0.140 | 0.420 | 0.620 |

FIG. 17

| | U | CU | CL | L |
|---|---|---|---|---|
| VIRTUAL UPPER MONITOR SUBSTRATE | 1.000 | 0.000 | 0.000 | 0.000 |
| UPPER TEMPERATURE MONITOR | 0.640 | 0.320 | -0.060 | -0.020 |
| CENTRAL TEMPERATURE MONITOR | -0.060 | 0.280 | 0.800 | -0.080 |
| LOWER TEMPERATURE MONITOR | -0.080 | -0.140 | 0.420 | 0.620 |

# SUBSTRATE PROCESSING EQUIPMENT

TECHNICAL FIELD

The present invention relates to a substrate processing equipment that processes substrates such as silicon wafer or the like.

BACKGROUND ART

In the case where substrates such as silicon wafer or the like are subjected to heat treatment with a vertical-type heat treating furnace, it is well known to control the output of a heater provided around a reaction chamber in order to have substrate temperatures approaching a set temperature (target value).

For example, Patent Document 1 discloses control of the outputs of heaters on the basis of thermal interference, to which substrates in a reaction chamber are subjected from a plurality of the heaters, and errors of substrate temperatures relative to a set temperature.

In the case where substrates being processed are large in size, however, there is in some cases generated a large difference between temperature changes detected in the reaction chamber and temperature changes in substrates.
Patent Document 1: JP-A-2002-175123

DISCLOSURE OF THE INVENTION

Problems to be Solved by the Invention

The invention has been thought of in view of the background described above, and has its object to provide a substrate processing equipment that can easily control temperature of a substrate.

Measure for Solving the Problems

In order to attain the object, a first substrate processing equipment according to the invention comprises heating means that heats a substrate accommodated in a processing chamber, temperature detection means that detects temperature in the processing chamber, substrate temperature prediction means that predicts temperature of the substrate periodically, and control means that mixes that temperature in the processing chamber, which is detected by the temperature detection means, and a predicted temperature, which is predicted by the substrate temperature prediction means in a previous period, to use the substrate temperature prediction means to predict temperature in a period subsequent to the previous period, to control the heating means with the use of the predicted temperature.

Also, a second substrate processing equipment according to the invention comprises heating means that heats a substrate accommodated in a processing chamber, first temperature detection means that detects temperature in the neighborhood of the heating means, second temperature detection means that detects temperature in the neighborhood of the substrate, and control means that mixes a first predicted temperature of the substrate calculated from the temperature detected by the first temperature detection means and a second predicted temperature of the substrate calculated from the temperature detected by the second temperature detection means to control the heating means with the use of the predicted temperature as mixed.

Preferably, the heating means comprises a plurality of zone heating means corresponding to a plurality of heating zones, and the substrate temperature prediction means calculates a detection predicted value of corresponding virtual temperature detection means every substrate being an object of the predicted temperature, according to an extent, to which the plurality of zone heating means, respectively, interfere with the substrate being an object of a predicted temperature, and predicts temperature in a period subsequent to the previous period by means of the detection predicted value and the predicted temperature in the previous period.

Also, preferably, the control means varies a mixing ratio of the first predicted temperature and the second predicted temperature of the substrate according to a magnitude of variation of temperature detected by the second temperature detection means.

Also, preferably, the heating means comprises a plurality of zone heating means, the temperature detection means comprises zone-temperature detection means corresponding to the zone heating means, respectively, and the control means sets virtual temperature detection means in a position nearer to a substrate, of which temperature is to be predicted, than to other substrates, calculates a detection value of the virtual temperature detection means on the basis of the corresponding relationship between the virtual temperature detection means and the zone-temperature detection means and a measured value measured by the zone-temperature detection means, predicts a substrate temperature in a period subsequent to the previous period by means of the detection value as calculated and that substrate temperature in the previous period, which is predicted by the virtual temperature detection means, and controls the respective zone heating means on the basis of the substrate predicted temperature.

Also, preferably, the heating means comprises a plurality of zone heating means, the temperature detection means comprises first zone-temperature detection means and second zone-temperature detection means, which correspond to the zone heating means, respectively, and the control means sets virtual temperature detection means in a position nearer to a substrate, of which temperature is to be predicted, than to other substrates, calculates a detection value of the virtual temperature detection means on the basis of the corresponding relationship between the virtual temperature detection means and the first zone-temperature detection means or the second zone-temperature detection means and a measured value measured by the first zone-temperature detection means or the second zone-temperature detection means, predicts a substrate temperature in a period subsequent to the previous period by means of the detected value as calculated and that substrate temperature in the previous period, which is predicted by the virtual temperature detection means, and controls the respective zone heating means on the basis of the substrate predicted temperature.

Also, preferably, there is further provided output means that outputs a temperature detected by the temperature detection means in substantially the same period as that period, in which the control means controls output of the heating means, by displaying and recording or either of them.

Also, a first substrate processing method according to the invention comprises the steps of heating a substrate accommodated in a processing chamber, detecting a temperature in the processing chamber, predicting a temperature of the substrate periodically, and mixing the detected temperature in the processing chamber and a predicted temperature, which is predicted periodically in a previous period, to predict a temperature in a period subsequent to the previous period to control heating of the substrate with the use of the predicted temperature.

Also, a second substrate processing method, according to the invention, for a substrate processing equipment comprising a reaction chamber that processes a substrate, heating means that heats an interior of the reaction chamber, control means that controls the heating means, first temperature detection means that detects temperature between the heating means and the substrate, and second temperature detection means that detects temperature nearer to the substrate than the first temperature detection means, comprises the steps of measuring a temperature with the first temperature detection means, calculating a first substrate predicted temperature from the temperature measured by the first temperature detection means, measuring a temperature with the second temperature detection means, calculating a second substrate predicted temperature from the temperature measured by the second temperature detection means, and mixing the first substrate predicted temperature and the second substrate predicted temperature to control the heating means.

Effect of the Invention

According to the invention, temperatures of substrates are predicted, so that it is possible to easily control temperatures of substrates.

BRIEF DESCRIPTION OF THE DRAWINGS

FIG. 12 is a table illustrating those variations of substrate-edge temperatures W shown in FIG. 11, in which the temperature in the reactor when it becomes flat is set as a standard.

FIG. 13 is a table illustrating ratios (variations÷sum of variations) of respective "variations" of the four temperature adjustment zones to "sums of variations", shown in FIG. 12, of the upper temperature monitor, the lower temperature monitor, and the central temperature monitor, respectively.

FIG. 16 is a graph illustrating variations of substrate-edge temperatures W in step-up for the upper temperature monitor, the lower temperature monitor, and the central temperature monitor, respectively.

FIG. 17 is a table illustrating variations of substrate-edge temperatures W in step-up for a virtual upper monitor substrate in addition to variations of the substrate-edge temperatures W in step-up illustrated in FIG. 16.

BEST MODE FOR CARRYING OUT THE INVENTION

Background of the Invention

In order to facilitate the understanding of the invention, an explanation will be first given to that background, in which the invention has been thought of, prior to the explanation of embodiments.

[Semiconductor Processing Equipment 1]

Figure 1:
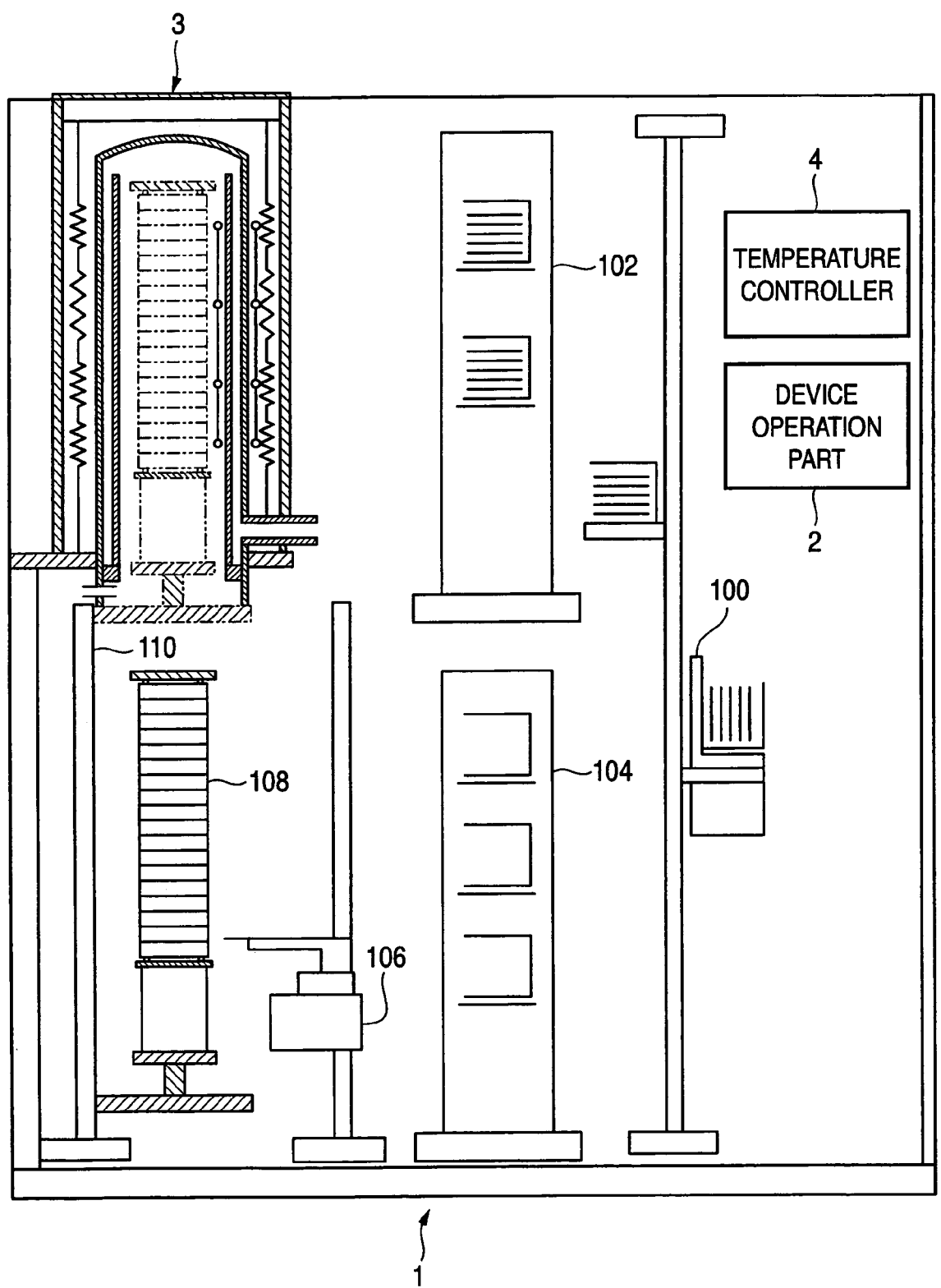
FIG. 1 is a view showing a whole construction of a semiconductor processing equipment, to which the invention is applied.

FIG. 1 is a view showing a whole construction of a semiconductor processing equipment 1, to which the invention is applied.

Figure 2:
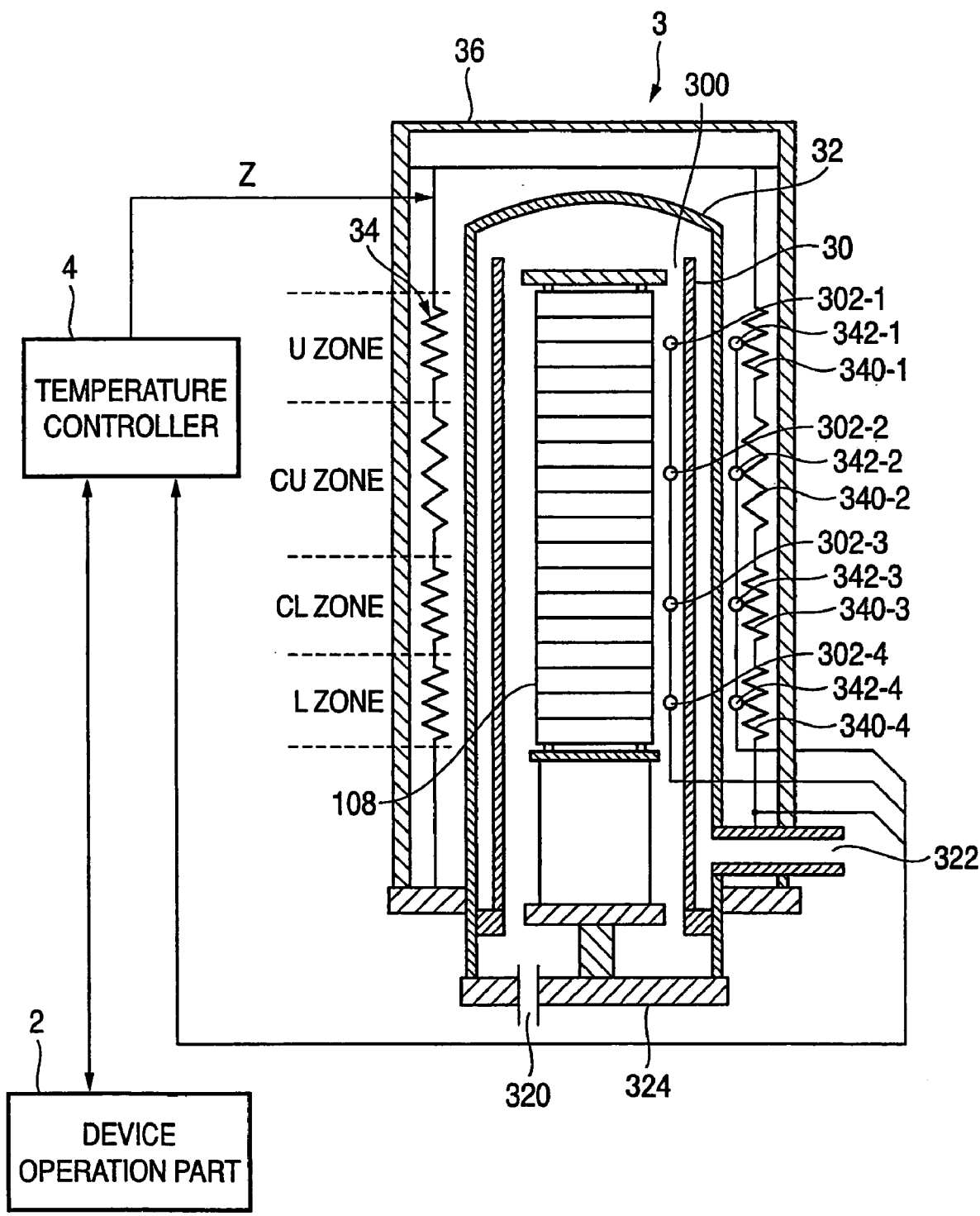
FIG. 2 is a view illustrating a reactor put in a state of accommodating a boat shown in FIG. 1 and its neighborhood.

FIG. 2 is a view illustrating a reactor (processing chamber) 3 put in a state of accommodating a boat 108 shown in FIG. 1 and its neighborhood.

As shown in FIG. 1, the semiconductor processing equipment 1 comprises a cassette transfer machine 100, a cassette stocker 102 provided on a back side of the cassette transfer machine 100, transfer shelves 104 provided below the cassette stocker 102, a substrate transfer machine 106 provided on a back side of the transfer shelves 104, an elevator 110 provided on a back side of the substrate transfer machine 106 to elevate the boat 108, on which a plurality of substrates are set, the reactor 3 provided above the elevator 110, a temperature controller 4 that controls temperature in the reactor 3, and a device operation part 2 operated by an operator to control respective parts constituting the semiconductor processing equipment 1.

As shown in FIG. 2, the reactor 3 shown in FIG. 1 comprises a cylindrical-shaped inner tube 30, an outer tube 32 made of, for example, quartz, a heater 34 formed around the outer tube 32 to be cylindrical-shaped, a gas introduction port 320, a gas discharge port 322, a seal cap 324, and other constituent parts such as a gas flow regulator (not shown) or the like, and is covered by an insulating material 36.

The heater 34 includes zone heaters 340-1 to 340-4, respectively, affording setting and adjustment of temperature.

The zone heaters 340-1 to 340-4 are materialized by taking out a plurality of taps from, for example, a single continuous winding of the heater 34, or providing four heaters, respectively, having independent windings.

In this manner, four temperature adjustment zones (U, CU, CL, L), respectively, affording setting and adjustment of temperature by the zone heaters 340-1 to 340-4 are formed in the reactor 3.

The zone heaters 340-1 to 340-4, respectively, of the heater 34 are connected to the device operation part 2 through the temperature controller 4 to heat an interior of the reactor 3 on the basis of control by the device operation part 2. Outer thermocouples 342-1 to 342-4 sample temperatures in the neighborhood of the zone heaters 340-1 to 340-4, respectively, to detect the same.

The inner tube 30 is formed therein with a reaction chamber 300.

Inner thermocouples 302-1 to 302-4 are arranged in those positions in the reaction chamber 300, which correspond to the temperature adjustment zones (U, CU, CL, L), respectively.

The inner thermocouples 302-1 to 302-4 sample temperatures in the neighborhood of substrates in the respective temperature adjustment zones (U, CU, CL, L) to detect the same.

The outer tube 32 and the inner tube 30 are provided to be concentric with the heater 34, and a closed, cylindrical-shaped space is formed between the tubes.

The boat 108 is arranged in the reactor 3 in a manner to rotate circumferentially of substrates when the substrates are processed.

Also, the inner thermocouples 302-1 to 302-4 and the outer thermocouples 342-1 to 342-4, respectively, can detect temperatures when the substrates, respectively, are processed.

In addition, in the case where any one of a plurality of constituent parts such as the inner thermocouples 302-1 to 302-4, etc. is indicated without identification, it is simply abbreviated as the inner thermocouple 302 in the following description.

Also, the four temperature adjustment zones (U, CU, CL, L), respectively, are in some cases abbreviated as U zone (U), CU zone (CU), CL zone (CL), and L zone (L) in the following description.

[Device Operation Part 2]

Figure 3:
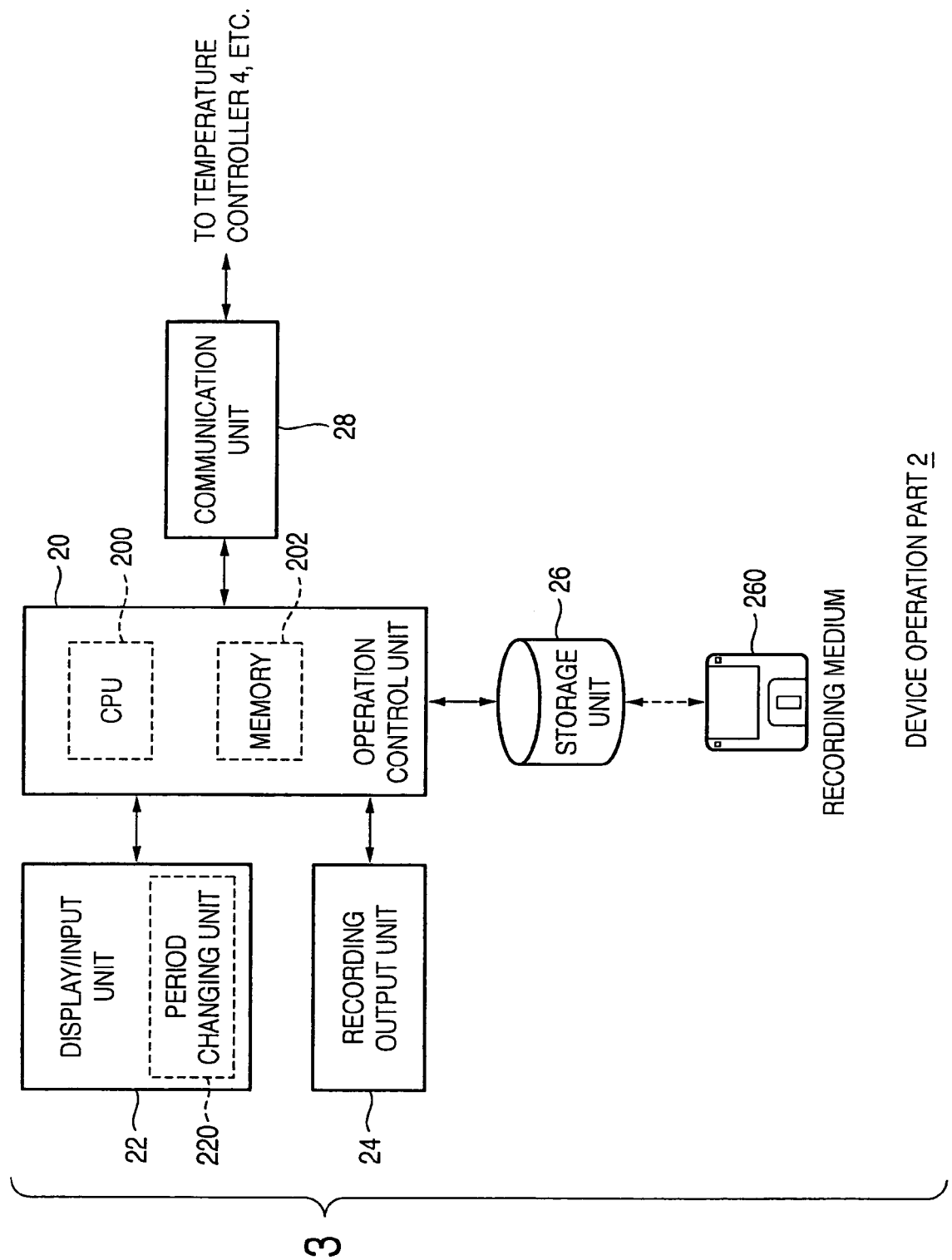
FIG. 3 is a view showing the construction of a device operation part.

FIG. 3 is a view showing the construction of the device operation part 2.

As shown in FIG. 3, the device operation part 2 comprises an operation control unit 20, a display/input unit 22, a recording output unit 24, a storage unit 26, and a communication unit 28.

The operation control unit 20 includes a CPU 200, a memory 202, etc., controls respective units that constitute the device operation part 2, and controls, through the communication unit 28, parts that constitute the semiconductor processing equipment 1.

The display/input unit 22 comprises, for example, a touch panel, includes a period changing unit 220, receives setting for the semiconductor processing equipment 1, set temperatures (target values), and instructions from an operator, and displays operative information or the like of the semiconductor processing equipment 1.

When receiving, for example, an instruction of changing a period of the output from an operator, the period changing unit 220 changes a period of outputting temperature data, which the temperature controller 4 has received from the inner thermocouple 302 and the outer thermocouple 342, to the recording output unit 24 and the storage unit 26 through the operation control unit 20.

For example, the period changing unit 220 causes temperature data, which the temperature controller 4 has received from the inner thermocouple 302, the outer thermocouple 342, etc., to be output to the recording output unit 24 and the storage unit 26 in substantially the same period as that period, in which the operation control unit 20 controls the heater 34 through the temperature controller 4.

The recording output unit 24 records on, for example, graph paper, and outputs results of detection of the inner thermocouple 302, the outer thermocouple 342, etc. according to that period, which is set by the period changing unit 220.

The storage unit 26 comprises, for example, HDD, CD, etc. to store information (recipe) of a processing sequence performed by the semiconductor processing equipment 1, and information received through the communication unit 28 and a recording medium 260.

The recipe is set through the device operation part 2 by an operator and stored in the storage unit 26.

That is, the device operation part 2 includes a constituent part as a common computer capable of controlling the semiconductor processing equipment 1.

In this manner, the device operation part 2 has these constituent parts controlling the respective constituent parts of the semiconductor processing equipment 1 to perform processings on substrates.

[Temperature Controller 4]

Figure 4:
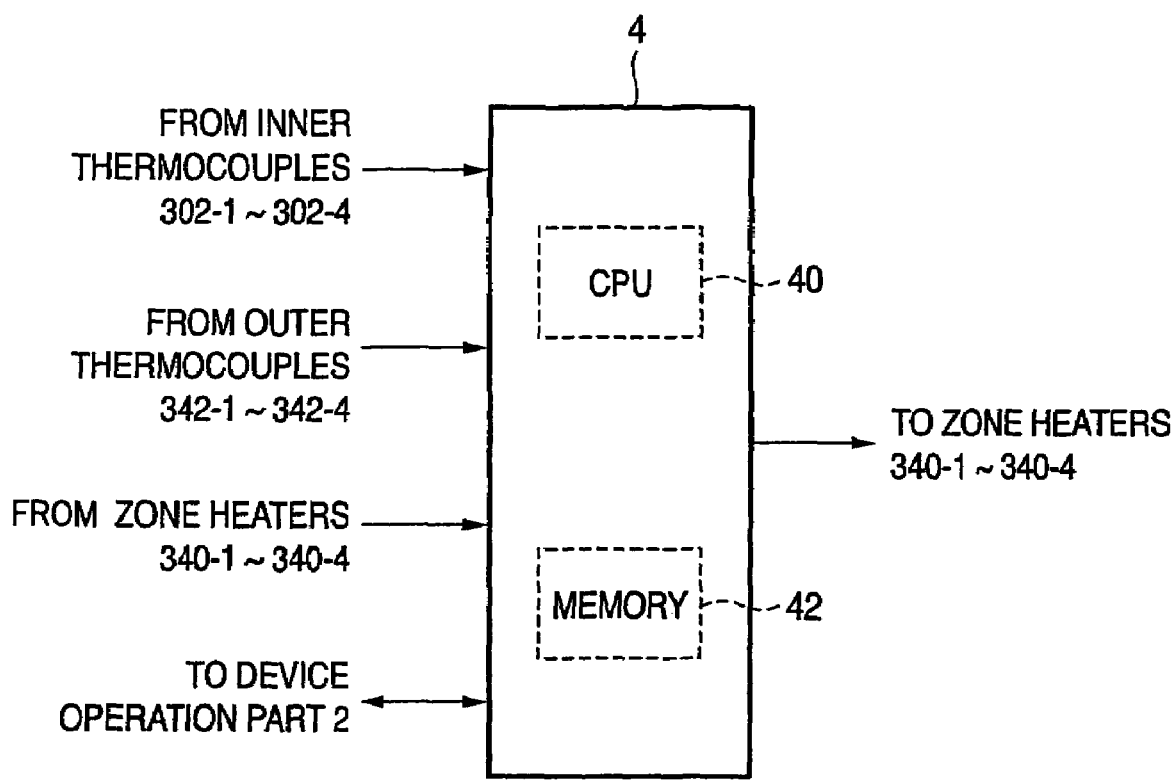
FIG. 4 is a view showing the construction of a temperature controller.

FIG. 4 is a view showing the construction of the temperature controller 4.

As shown in FIG. 4, the temperature controller 4 includes a CPU 40, a memory 42, etc., receives temperature data from the inner thermocouples 302-1 to 302-4 and the outer thermocouples 342-1 to 342-4, respectively, receives respective electric power values of the zone heaters 340-1 to 340-4, and receives from the device operation part 2 a set temperature S (target value) set by an operator and control signals such as parameters described later, etc. to output electric power values (operating variables Z) to the zone heaters 340-1 to 340-4 to vary amounts of heat generated by the zone heaters 340-1 to 340-4.

Also, the temperature controller 4 outputs to the device operation part 2 temperature data received from the inner thermocouple 302 and the outer thermocouple 342, and electric power values received from the zone heaters 340-1 to 340-4, respectively.

[Outline of Processings Performed by the Semiconductor Processing Equipment 1]

The semiconductor processing equipment 1 comprises, for example, a vertical type CVD device, and is controlled by constituent parts thereof according to the operation of the device operation part 2 (FIG. 1) to use CVD to form (film-creating processing) $Si_3N_4$ film, $SiO_2$ film, and poly-silicon (Poly-Si) film on and perform annealing treatment on substrates placed at predetermined intervals on the boat 108 in the reactor 3.

Processings performed by the semiconductor processing equipment 1 will be described further.

First, the cassette transfer machine 100 transfers cassettes, which accommodate a plurality of substrates, to the cassette stocker 102 to store them, and transfers the cassettes to the transfer shelves 104, in which the substrates are taken out from the cassettes.

Subsequently, the substrate transfer machine 106 takes out the substrates from the cassettes placed on the transfer shelves 104 to place the substrates on the boat 108.

When a predetermined number of the substrates are placed on the boat 108, the elevator 110 inserts the boat 108 into the reaction chamber 300.

Then, the reactor 3 is closed by the seal cap 324.

In the reactor 3, the substrates are heated to processing temperatures by the zone heaters 340-1 to 340-4 and then processing gases are introduced from the gas introduction port 320.

At the time of heating, the temperature controller 4 controls electric power values for the zone heaters 340-1 to 340-4 on the basis of temperatures detected by the outer thermocouples 342-1 to 342-4 and the inner thermocouples 302-1 to 302-4, respectively, and control signals received from the device operation part 2.

The processing gases rise toward the substrates placed on the boat 108 disposed in the reaction chamber 300, and processings are performed on the substrates.

The processing gases after processing are discharged from the gas discharge port 322.

When processings on the substrates is terminated, the boat 108 is unloaded from the reaction chamber 300, for example, after temperature in the reactor 3 is lowered, and the boat 108 is caused to stand by in a predetermined position until all the substrates supported on the boat 108 are cooled.

When the substrates are cooled to a predetermined temperature, the substrate transfer machine 106 takes out the substrates from the boat 108 to store the same in the cassettes on the transfer shelves 104.

The cassettes, in which the substrates having been processed are accommodated, are carried out by the cassette transfer machine 100 and the processing is finished.

[Temperature Change During Processings in the Reactor 3]

Subsequently, temperature change in the reactor 3 in the processings of the semiconductor processing equipment 1 will be described.

Figure 5:
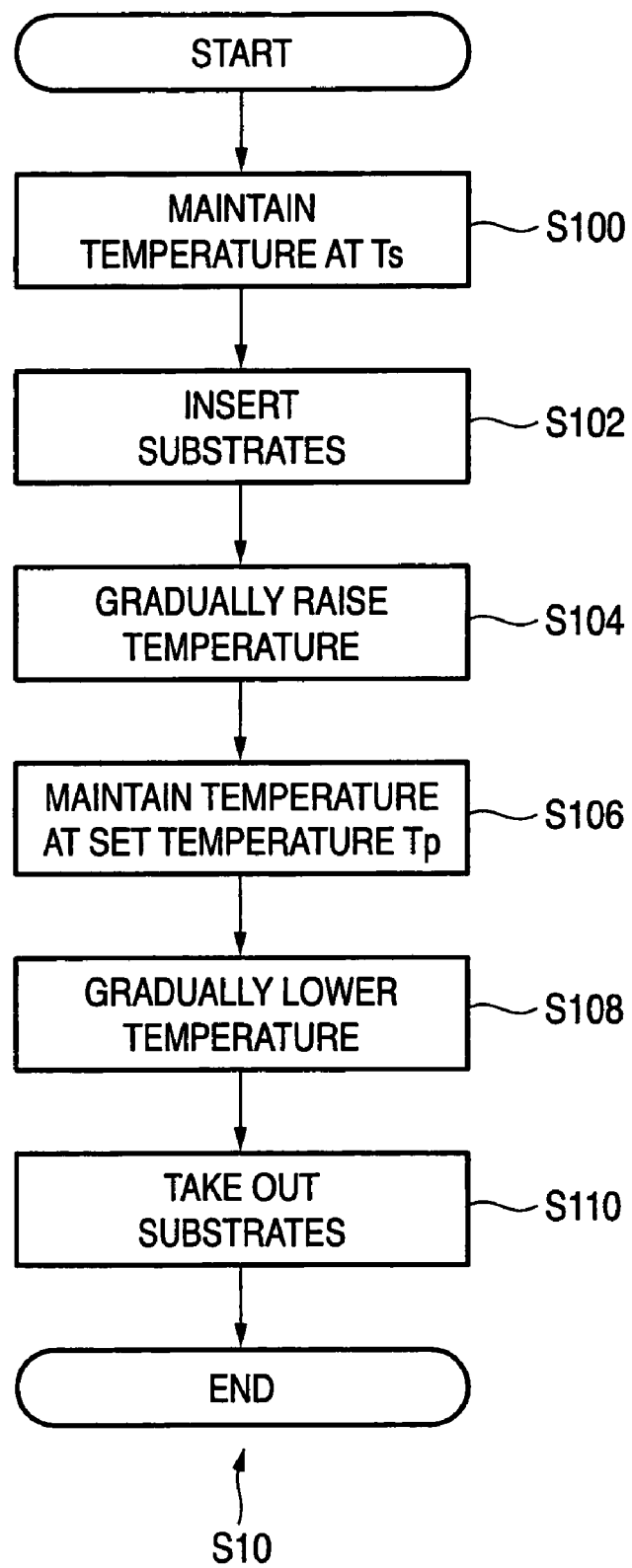
FIG. 5 is a flowchart (S10) illustrating processes, which correspond to temperature change in a reactor, in the sequence of processings carried out by the semiconductor processing equipment.

FIG. 5 is a flowchart (S10) illustrating processes, which correspond to temperature change in the reactor 3, in the sequence of processings, described above, by the semiconductor processing equipment 1.

Figure 6:
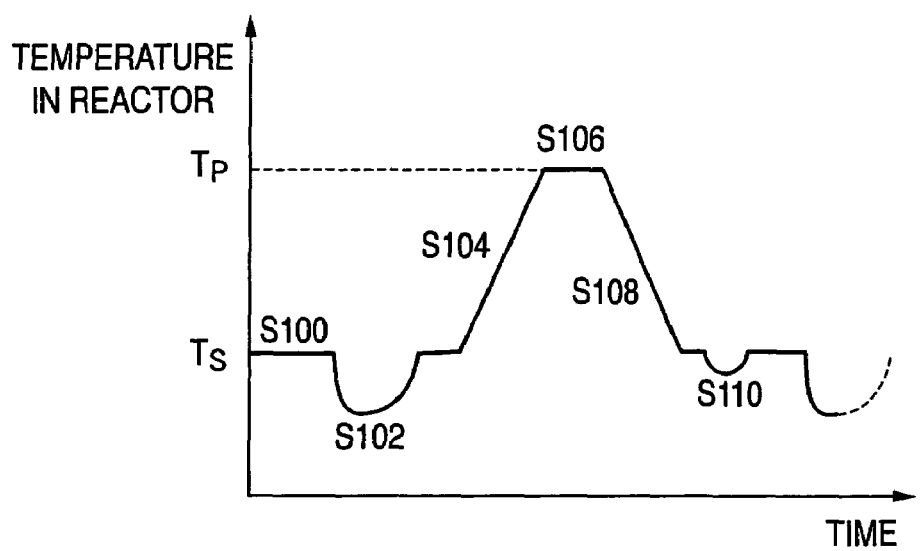
FIG. 6 is a graph illustrating an outline of temperature change in the reactor in a manner to correspond to S10 shown in FIG. 5.

FIG. 6 is a graph illustrating an outline of temperature change in the reactor 3 in a manner to correspond to S10 shown in FIG. 5.

As shown in FIG. 5, the heater 34 performs heating in STEP 100 (S100) in a manner to maintain the reactor 3 at temperature Ts lower than temperature set at the time of processing before the boat 108 is inserted into the reactor 3.

In STEP 102 (S102), the substrates placed on the boat 108 are inserted into the reactor 3.

Temperature in the reactor 3 is caused to once fall (see FIG. 6) from Ts due to insertion of the boat 108, and thereafter returned to Ts by the heater 34.

In STEP 104 (S104), the heater 34 causes temperature in the reactor 3 to gradually rise to a set temperature Tp for a processing such as film-creating processing, etc. on the basis of an electric power value received from the temperature controller 4 (ramp-up).

In STEP 106 (S106), the heater 34 maintains temperature in the reactor 3 at the set temperature Tp so that a processing such as film-creating processing, etc. is performed on the substrates.

In STEP 108 (S108), the heater 34 causes temperature in the reactor 3 to fall gradually from Tp to Ts on the basis of an electric power value received from the temperature controller 4 (ramp-down).

In STEP 110 (S110), the substrates placed on the boat 108 are taken out from the reactor 3.

Temperature in the reactor 3 falls from Ts since the boat 108 is taken out from the reactor 3.

Since a sequence (S10) of processings performed by the semiconductor processing equipment 1 is repeatedly executed, the processings can be enhanced in productivity by executing respective STEPs in a short time.

In the case where the substrates have a diameter of 300 mm or the like, however, temperature change detected in the reaction chamber 300 is in some cases different from temperature change in the substrates.

Figure 7:
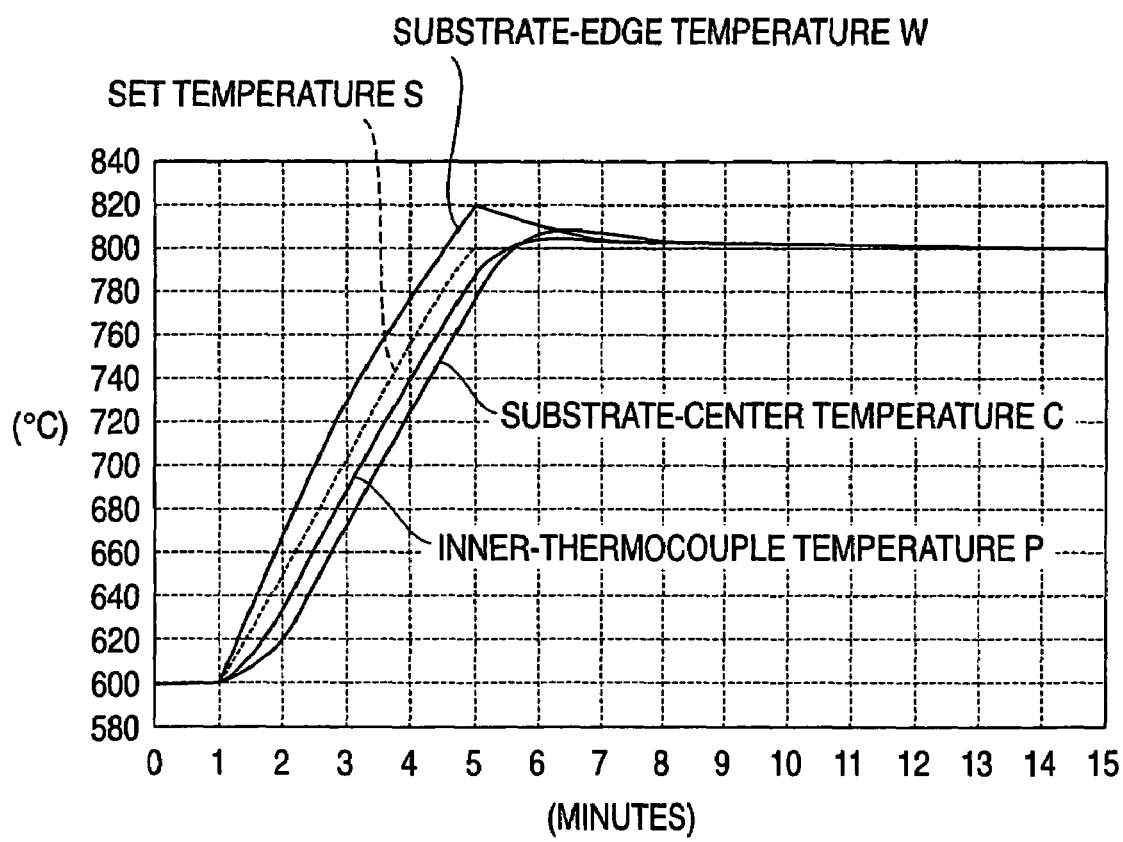
FIG. 7 is a view illustrating an example of changes in temperature of an inner thermocouple and temperature in a substrate when the reactor undergoes ramp-up.

FIG. 7 is a view illustrating an example of changes in temperature of the inner thermocouple 302 and temperature in the substrates when the reactor 3 undergoes ramp-up.

As shown in FIG. 7, in the case where substrates having a diameter of, for example, 300 mm are caused to rise in temperature in the reactor 3 (FIG. 2), an inner-thermocouple temperature P detected by the inner thermocouple 302, temperature (substrate-center temperature C) of a center of the substrate, and temperature (substrate-edge temperature W) of an edge (outer periphery) of the substrate are varied in a different manner from that, in which a set temperature S set for the heater 34 by an operator through the device operation part 2 is varied.

In addition, in the case where any one of temperatures, such as substrate-center temperature C, substrate-edge temperature W, etc., detected in different positions on a substrate is indicated without identification, it is simply abbreviated as substrate temperature in the following description.

Figure 8:
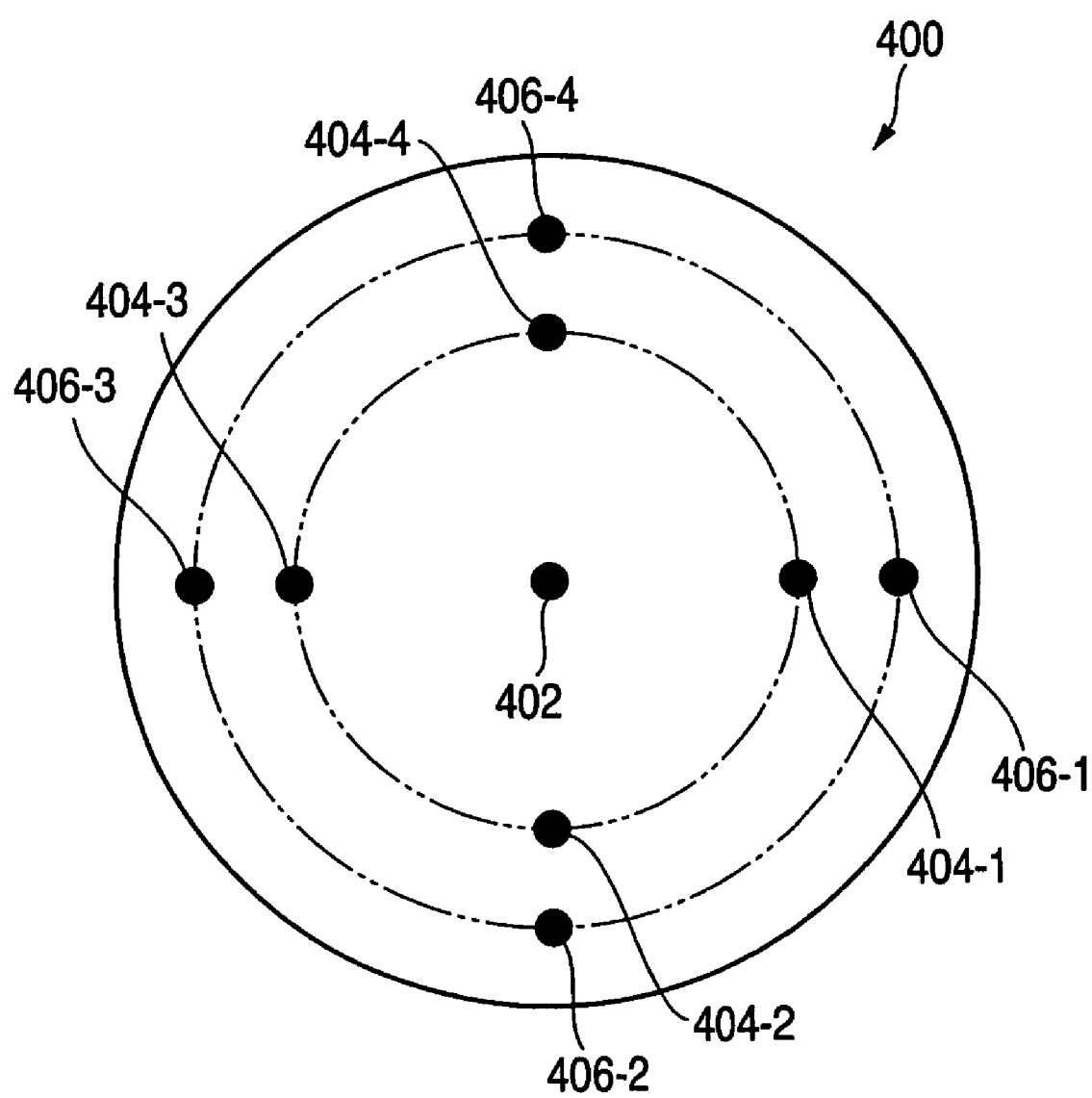
FIG. 8 is a view showing temperature detection positions on a temperature monitor substrate.

FIG. 8 is a view showing temperature detection positions on a temperature monitor substrate 400.

As shown in FIG. 8, the temperature monitor substrate 400 is provided with nine thermocouples, such as a central thermocouple 402 on a center of the temperature monitor substrate 400, four inner periphery thermocouples 404-1 to 404-4 on an inner periphery thereof, outer periphery thermocouples 406-1 to 406-4 on an outer periphery thereof, and the respective thermocouples output detected temperature to, for example, the temperature controller 4.

That is, the temperature monitor substrate 400 is placed on the boat 108 whereby temperatures of substrates when processed in the reactor 3 can be detected in the same positions before the processings.

Also, when substrates are actually processed, the substrates are rotated in a state of being placed on the boat 108, so that temperature (substrate-edge temperature W) of, for example, outer peripheries of the substrates are made an average value of temperatures detected by the respective outer periphery thermocouples 406-1 to 406-4.

Figure 9:
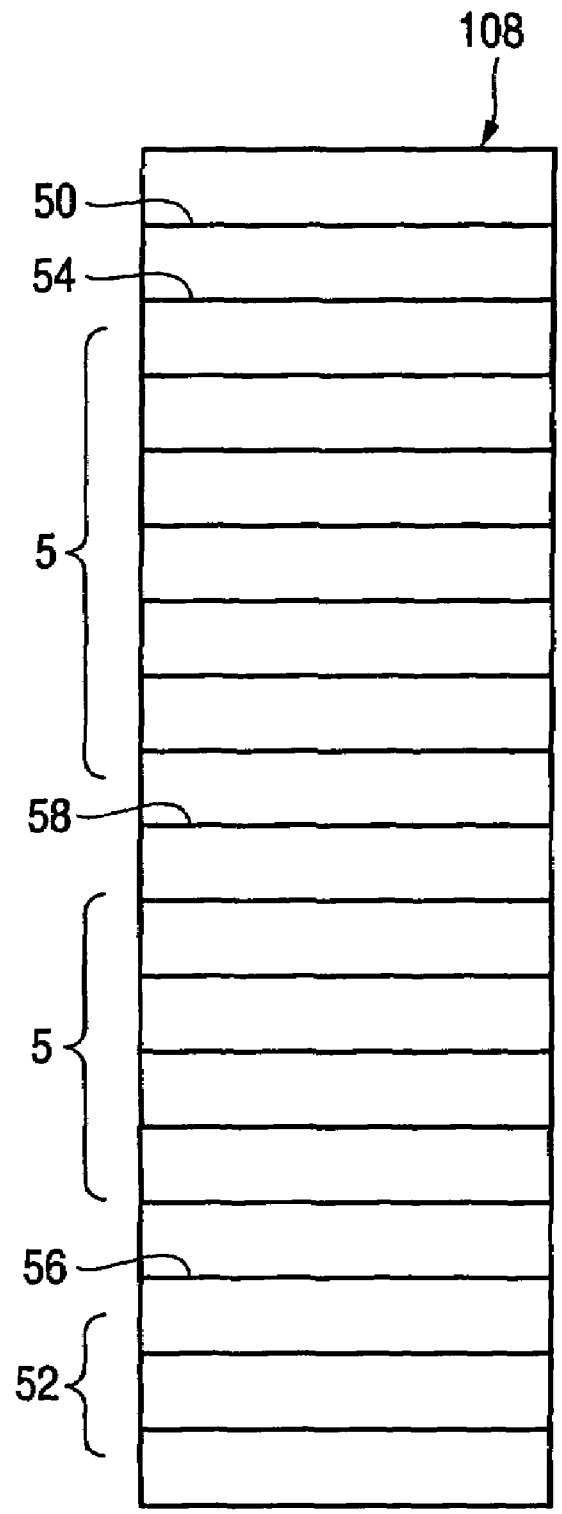
FIG. 9 is a schematic view showing an example of an arrangement of substrates in the boat.

FIG. 9 is a schematic view showing an example of an arrangement of substrates in the boat 108.

As shown in FIG. 9, when substrates 5 for products are processed in the reactor 3, upper dummy substrates 50 and lower dummy substrates 52, respectively, are arranged in the vicinity of uppermost and lowermost portions of the boat 108.

Since it is difficult to perform film-creating in the vicinity of uppermost and lowermost portions of the boat 108 at the time of, for example, film-creating processing so that substrates make products, the upper dummy substrates 50 and the lower dummy substrates 52 are provided and changed in number as arranged according to a kind of processing and a kind of a device.

Also, in the boat 108, an upper monitor substrate 54 is arranged below the upper dummy substrates 50, a lower monitor substrate 56 is arranged above the lower dummy substrates 52, and a plurality of substrates 5 for products are arranged between the upper monitor substrate 54 and the lower monitor substrate 56.

Further, a central monitor substrate 58 is arranged in the vicinity of a center of the plurality of substrates 5 arranged between the upper monitor substrate 54 and the lower monitor substrate 56.

When the substrates 5 are to be processed, the upper monitor substrate 54, the lower monitor substrate 56, and the central monitor substrate 58 are arranged, for example, one by one and made an indicator for confirmation of results of film-creation on the substrates 5.

The temperature monitor substrates 400, respectively, are arranged in positions of the upper monitor substrate 54, the lower monitor substrate 56, and the central monitor substrate 58 before the processings whereby substrate-center temperatures C and substrate-edge temperatures W described above are detected in respective positions on the upper monitor substrate 54, the lower monitor substrate 56, and the central monitor substrate 58.

A substrate-center temperature C and a substrate-edge temperature W are varied in positions of, for example, the central monitor substrate 58 as shown in FIG. 7.

In addition, temperature monitor substrates 400, respectively, arranged in positions of the upper monitor substrate 54, the lower monitor substrate 56, and the central monitor substrate 58 in the boat 108 are in some cases abbreviated as upper temperature monitor, lower temperature monitor, and central temperature monitor in the following description.

Also, in the case where any one of the upper temperature monitor, the lower temperature monitor, and the central temperature monitor is indicated without identification, it is simply abbreviated as temperature monitor.

In FIG. 7, in the case where a set temperature S is changed from 600° C. to 800° C. at a rate of 50° C. per minute, an inner-thermocouple temperature p indicated by the inner-thermocouple 302 rises later than the set temperature S and becomes flat at about 800° C. after a little past 800° C.

On the other hand, the substrate-edge temperature W rises just after the start of ramp-up while being put in a state of being higher than the set temperature S, and gradually falls, when the set temperature S rises to 800° C., to become flat at about 800° C.

Also, the substrate-center temperature C rises further later than the inner-thermocouple temperature P and becomes flat at about 800° C. after becoming higher than the inner-thermocouple temperature P.

In this manner, in the case where the output of the heater 34 is controlled by PID control or the like so that the inner-thermocouple temperature P of the inner thermocouple 302 approaches the set temperature S, a substrate-edge temperature W and a substrate-center temperature C are in some cases varied in different characteristics from that of the inner-thermocouple temperature P.

For example, in the case where the substrates 5 (FIG. 9) have a diameter of 300 mm, overshoot of substrate-edge temperature W and substrate-center temperature C over the set temperature S is in some cases large in a batch type reactor 3 (FIG. 2), in which substrates placed on the boat 108 is small in number and large in intervals therebetween, when the inner thermocouple 302 being harder to receive an amount of heat than the substrates 5 is controlled by PID control in a manner to approach the set temperature S, so that it takes long until they become flat.

Embodiment

An embodiment of the invention will be described below. According to the following embodiment, there is specifically shown a semiconductor processing equipment 1, in which prior to processing of substrates for products, temperature monitor substrates 400 are arranged in respective positions of an upper monitor substrate 54, a lower monitor substrate 56, and a central monitor substrate 58 to detect substrate-center temperatures C and substrate-edge temperatures W.

In the semiconductor processing equipment 1 (FIG. 1) including the reactor 3 shown in FIG. 2, before the substrates 5 for products are processed, the temperature controller 4 varies temperature in the reactor 3 on the basis of control by the device operation part 2 in the same manner as that when the substrates 5 are processed, and receives temperature changes in those positions, in which the respective thermocouples are arranged, through the temperature monitor substrates 400 arranged in respective positions of the upper monitor substrate 54, the lower monitor substrate 56, and the central monitor substrate 58, the inner thermocouples 302-1 to 302-4, and the outer thermocouples 342-1 to 342-4 to predict temperatures of the substrates 5 when the plurality of the substrates 5 (see FIG. 9) are processed.

[Substrate-temperature Predictive Control of the Semiconductor Processing Equipment 1]

The semiconductor processing equipment 1 predicts substrate temperatures and controls the output of the heater 34 so that predicted substrate temperatures approach a set temperature, thus performing predictive control of substrate temperatures.

Also, the semiconductor processing equipment 1 includes the temperature controller 4 that acquires temperature data required for substrate-temperature predictive control, and the device operation part 2 that inputs parameters required for substrate-temperature predictive control and receives instructions for execution of substrate-temperature predictive control as described above.

An explanation will be given below to prediction of substrate temperatures, substrate-temperature predictive control based on predicted substrate temperatures, acquisition of temperature data required for substrate-temperature predictive control, input of parameters required for substrate-temperature predictive control, and execution of substrate-temperature predictive control.

[Prediction of Substrate Temperatures]

Figures 10, 11:
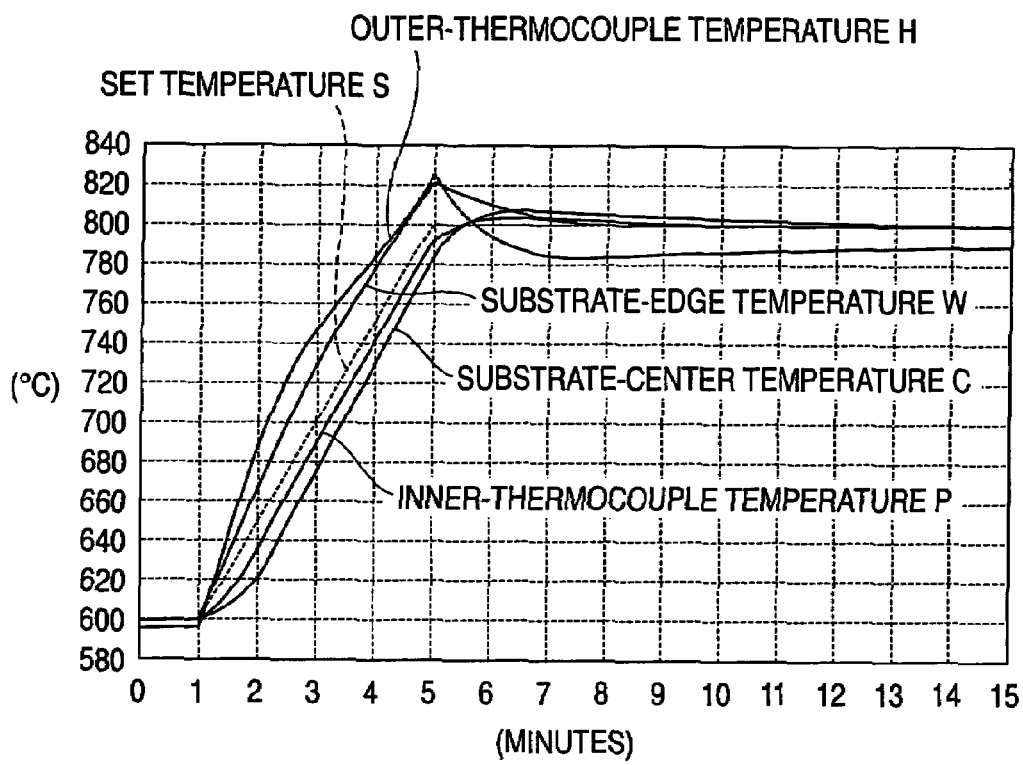
FIG. 10 is a graph illustrating an example of changes in outer-thermocouple temperature H of an outer thermocouple in addition to an example of changes in temperature of the inner thermocouple illustrated in FIG. 7.
FIG. 11 is a table illustrating an example of changes in substrate-edge temperatures W of an upper temperature monitor, a lower temperature monitor, and a central temperature monitor in the case where a set temperatures S for the inner thermocouple is raised (step-up) one zone at a time by 5° C. for four temperature adjustment zones.

FIG. 10 is a graph illustrating an example of changes in an outer-thermocouple temperature H of the outer thermocouple 342 in addition to an example of changes in temperature of the inner thermocouple 302 illustrated in FIG. 7.

Since the outer thermocouple 342 detects a temperature in the reactor 3, in a position nearest to the zone heater 340 that constitutes a heat source, response of the outer-thermocouple temperature H to changes in a set temperature S set in the zone heater 340 is faster than response of a substrate-edge temperature W.

Also, since the inner thermocouple 302 is harder to receive an amount of heat than substrates, response of an inner-thermocouple temperature P to changes in the set temperature S is later than response of the substrate-edge temperature W.

In this manner, the outer-thermocouple temperature H responds fastest to changes in temperature of the zone heater 340, and the substrate-edge temperature W, the inner-thermocouple temperature P, and a substrate-center temperature C respond in this order subsequent to the outer-thermocouple temperature H.

In the semiconductor processing equipment 1, the temperature controller 4 calculates an electric power value (operating variable) to the zone heater 340 through PID calculation every control period of, for example, several hundreds ms to several seconds from temperatures detected by the respective thermocouples and the set temperature S on the basis of control by the device operation part 2, and controls (digital control) an amount of heat from the zone heater 340.

First, W(t) indicates a value of the predicted substrate-edge temperature W at a t-th (t being an integer) control period from the start of ramp-up, and W(t−1) indicates a value of the predicted substrate-edge temperature W at a (t−1)-th control period.

H(t) indicates a value of the outer-thermocouple temperature H at a t-th control period from the start of ramp-up, and H(t−1) indicates a value of the outer-thermocouple temperature H at a (t−1)-th control period.

Also, P(t) indicates a value of the inner-thermocouple temperature P at a t-th control period from the start of ramp-up, and P(t−1) indicates a value of the inner-thermocouple temperature P at a (t−1)-th control period.

FIG. 10 shows characteristics, in which response of the substrate-edge temperature W to changes in the set temperature S is later than response of the outer-thermocouple temperature H.

That is, the substrate-edge temperature W can be considered to change later than the outer-thermocouple temperature H.

Accordingly, assuming that the substrate-edge temperature W is a temperature of a single system, a substrate-edge temperature W(t) is represented by first-order lag calculation of an outer-thermocouple temperature H(t), and can further be represented by the following Formula 1 by adjusting a mixing ratio of a substrate-edge temperature W(t−1) and an outer-thermocouple temperature H(t−1) with a time constant T1 of the substrate-edge temperature W.

[Formula 1]

$$W(t)=(K1 \times H(t-1)+T1 \times W(t-1)) \div (1+T1) \quad (1)$$

where K1 indicates a gain of the outer-thermocouple temperature H to the substrate-edge temperature W, and T1 is a time constant of the substrate-edge temperature W.

Also, FIG. 10 shows characteristics, in which response of the inner-thermocouple temperature P is later than response of the outer-thermocouple temperature H.

That is, the inner-thermocouple temperature P can be considered to change later than the outer-thermocouple temperature H.

Accordingly, assuming that the inner-thermocouple temperature P is temperature of a single system, an inner-thermocouple temperature P(t) is represented by first-order lag calculation of the outer-thermocouple temperature H(t), and can further be represented by the following Formula 2 by adjusting a mixing ratio of an inner-thermocouple temperature P(t−1) and the outer-thermocouple temperature H(t−1) with a time constant T2 of the inner-thermocouple temperature P.

[Formula 2]

$$P(t)=(K2 \times H(t-1)+T2 \times P(t-1)) \div (1+T2) \quad (2)$$

where K2 indicates a gain of the outer-thermocouple temperature H to the inner-thermocouple temperature P, and T2 is a time constant of the inner-thermocouple temperature P.

By transforming the Formula 1, the outer-thermocouple temperature H(t−1) is represented by the following Formula 3.

[Formula 3]

$$H(t-1)=\{(T1+1) \times W(t)-T1 \times W(t-1)\} \div K1 \quad (3)$$

Also, by substituting Formula 3 for Formula 2, the substrate-edge temperature W(t) is represented by the following Formula 4.

[Formula 4]

$$W(t)=\{K1 \times (T2+1) \times P(t)-K1 \times T2 \times P(t-1)+K2 \times T1 \times W(t-1)\} \{K2 \times (1+T1)\} \quad (4)$$

Here, an outer predicted temperature HW(t) indicates the substrate-edge temperature W(t) represented by Formula 1 and predicted from the outer-thermocouple temperature H.

Also, an inner predicted temperature PW(t) indicates the substrate-edge temperature W(t) represented by Formula 4 and predicted from the inner-thermocouple temperature P.

In Formula 4, the substrate-edge temperature W is predicted from the inner-thermocouple temperature P that changes relative to changes in the set temperature S later than response of the substrate-edge temperature W.

A mixing ratio of the outer predicted temperature HW(t) and the inner predicted temperature PW(t) is interpolated by a weight a(t) described later such that the outer predicted temperature HW(t) predicted from the outer-thermocouple temperature H is weighted in that region in FIG. 10, in which the inner-thermocouple temperature P is varied much, and the inner predicted temperature PW(t) predicted from the inner-thermocouple temperature P is weighted in that region, in which the inner-thermocouple temperature P is varied less, whereby a weighted substrate-edge predicted temperature W'(t) is represented by the following Formula 5.

[Formula 5]

$$W'(t)=(HW(t) \times a(t)+PW(t)) \div (a(t)+1) \quad (5)$$

The weight a(t) indicates a magnitude (rate of change) of variation of the inner-thermocouple temperature P and is represented by the following Formula 6.

[Formula 6]

$$a(t)=|\{(P(t)-P(t-1))+(a(t-1)\times b)\}\div(1+b)|\times C \quad (6)$$

where || in Formula 6 indicates an absolute value, b indicates a filter time constant of the weight a(t), and C indicates a weight gain of a(t).

As described above, the substrate-edge predicted temperature W'(t) can be found from the outer predicted temperature HW(t) and the inner predicted temperature PW(t).

In addition, it is necessary to set temperature predictive parameters "K1, T1, K2, T2, b, C" individually every semiconductor processing equipment 1 for predictive control of substrate temperatures.

Subsequently, an explanation will be given to a specific method of determining the outer predicted temperature HW(t) and the inner predicted temperature PW(t).

For example, in the case where the number of temperature monitor substrates 400 arranged in the boat 108 is consistent with the number of zone heaters 340 and measurement positions (heightwise direction) and number of outer thermocouples 342 and inner thermocouples 302, respectively, are consistent every temperature adjustment zone with arranged (placed) positions (heightwise direction) and number of the temperature monitor substrates 400, the substrate-edge predicted temperature W'(t) can be calculated by substituting corresponding values for Formula 1 to Formula 6.

On the other hand, since the four temperature adjustment zones (U, CU, CL, L) are provided in the semiconductor processing equipment 1 according to the embodiment of the invention and the temperature monitor substrates 400 are arranged one by one in positions of the upper monitor substrate 54, the lower monitor substrate 56, and the central monitor substrate 58 in the boat 108, it is necessary to calculate outer-thermocouple temperatures H and inner-thermocouple temperatures P, which constitute virtual temperature detection means corresponding to the three temperature monitor substrates 400, respectively, from four outer-thermocouple temperatures H and four inner-thermocouple temperatures P.

Since points of measurement by the inner thermocouples 302 and the outer thermocouples 342 are usually limited in number and not necessarily positioned (heightwise direction, and direction perpendicular to a main surface of a substrate) in the vicinity of positions (heightwise direction, and direction perpendicular to a main surface of a substrate) of a substrate desired to be measured and predicted, the virtual temperature detection means comprises detection means found by using the inner thermocouples 302 or the outer thermocouples 342 and the relationship of interference between respective substrates and the temperature adjustment zones to suppose an optimum position (heightwise direction, and direction perpendicular to a main surface of a substrate) nearest to the inner thermocouple 302 or the outer thermocouple 342 corresponding to a position (heightwise direction, and direction perpendicular to a main surface of a substrate) of a substrate desired to be measured and predicted.

In addition, while an explanation is given here by way of the inner thermocouple 302 or the outer thermocouple 342, application is possible when the relationship of interference between a substrate desired to be measured and predicted, and the temperature adjustment zones can be calculated.

For example, in the case where temperatures of the upper temperature monitor, the lower temperature monitor, and the central temperature monitor are to be predicted from temperatures detected by the outer thermocouples 342-1 to 342-4 and the inner thermocouples 302-1 to 302-4, respectively, outer-thermocouple temperatures H and inner-thermocouple temperatures P, which correspond to the respective temperature monitor substrates 400, are calculated by extents, to which the zone heaters 340-1 to 340-4, respectively, interfere with temperatures of the three temperature monitor substrates 400.

Specifically, the set temperatures S of the four temperature adjustment zones are raised (step-up) one at a time by 5° C. from, for example, a state, in which temperature in the reactor 3 becomes flat, and extents, to which the zone heaters 340-1 to 340-4, respectively, interfere with temperatures of the temperature monitor substrates 400, can be calculated from changes in substrate-edge temperatures W detected through the respective outer periphery thermocouples 406-1 to 406-4 of the upper temperature monitor, the lower temperature monitor, and the central temperature monitor.

FIG. 11 is a table illustrating an example of changes in substrate-edge temperatures W of the upper temperature monitor, the lower temperature monitor, and the central temperature monitor in the case where the set temperatures S for the inner thermocouples 302-1 to 302-4 are raised (step-up) one at a time by 5° C. for the four temperature adjustment zones.

As shown in FIG. 11, when the respective set temperatures S of the four temperature adjustment zones are raised (step-up) one at a time by 5° C., substrate-edge temperatures W of the upper temperature monitor, the lower temperature monitor, and the central temperature monitor undergo different temperature changes.

FIG. 12 is a table illustrating those variations of the substrate-edge temperatures W shown in FIG. 11, in which the temperature in the reactor 3 when it becomes flat is set as a standard.

First, an explanation is given to temperature changes in the upper temperature monitor.

In a state, in which temperature in the reactor 3 is flat (on a flat occasion shown in FIG. 11), the substrate-edge temperature W of the upper temperature monitor is 852.4° C.

First, when the set temperature S in only the U zone is raised by 5° C., the substrate-edge temperature W of the upper temperature monitor becomes 855.6° C., "variation" (FIG. 12) with a standard on a flat occasion is 3.2° C.

Likewise, in the case where the set temperatures S are sequentially raised one at a time by 5° C. for the CU zone, the CL zone, and the L zone, the substrate-edge temperatures W of the upper temperature monitors become 854.0° C., 852.1° C., and 852.3° C., and "variations" with standards on a flat occasion are 1.6° C., −0.3° C., and −0.1° C.

That is, when the U zone, the CU zone, the CL zone, and the L zone are raised one at a time by 5° C., temperature changes of 3.2° C., 1.6° C., −0.3° C., and −0.1° C., respectively, occur in the substrate-edge temperatures W of the upper temperature monitors.

Also, in the case where all the set temperatures for the four temperature adjustment zones are raised by 5° C. (the zone heaters 340-1 to 340-4, respectively, are raised by 5° C.), the substrate-edge temperatures W exhibit changes of "sum of variations" (FIG. 12) amounting to the sum of temperature changes of the respective temperature adjustment zones, and thus are raised in 4.4° C.

Likewise, for the lower temperature monitor and the central temperature monitor, the substrate-edge temperatures W (FIG. 11) when the lower temperature monitor and the central temperature monitor are stable, the substrate-edge temperatures W in the case where the set temperatures S are sequentially raised one at a time by 5° C. for the four temperature adjustment zones, and "variations" (FIG. 12) of the respective substrate-edge temperatures W with standards on a flat occasion are shown.

FIG. 13 is a table illustrating ratios (variations÷sum of variations) of respective "variations" of the four temperature adjustment zones to "sums of variations", shown in FIG. 12, of the upper temperature monitor, the lower temperature monitor, and the central temperature monitor.

That is, FIG. 13 shows rates (rates of interference), at which the zone heaters 340-1 to 340-4, respectively, interfere with temperature changes in the respective substrate-edge temperatures W of the upper temperature monitor, the lower temperature monitor, and the central temperature monitor in the case where the set temperatures S for the inner thermocouples 302-1 to 302-4 are varied in the zone heaters 340-1 to 340-4.

Inner-thermocouple temperatures p corresponding respectively to the upper temperature monitor, the lower temperature monitor, and the central temperature monitor are calculated with the rates of interference and used for prediction of substrate-edge predicted temperature W'(t).

For example, an inner-thermocouple temperature Ptop(t) used for prediction of a substrate-edge predicted temperature W'top(t) of the upper temperature monitor is represented by the following Formula 7 on the basis of the rates of interference shown in FIG. 13.

In addition, the inner-thermocouple temperature P becomes substantially the same as the set temperature S in several minutes after ramp-up as shown in, for example, FIG. 10.

[Formula 7]

$$Ptop(t)=\{Pu(t)\times 0.727\}+\{Pcu(t)\times 0.364\}+\{Pcl(t)\times(-0.068)\}+\{Pl(t)\times(-0.023)\} \quad (7)$$

where Pu(t), Pcu(t), Pcl(t), and Pl(t) indicate inner-thermocouple temperatures of the U zone, the CU zone, the CL zone, and the L zone, respectively.

The inner-thermocouple temperature Ptop(t) calculated with Formula 7 is substituted into Formula 4 to be used for calculation of an inner predicted temperature PWtop(t) of the upper temperature monitor.

Also, outer-thermocouple temperatures H corresponding respectively to the upper temperature monitor, the lower temperature monitor, and the central temperature monitor may be calculated on the basis of the rates of interference (FIG. 13), which are calculated with the set temperatures S for the inner thermocouples 302-1 to 302-4.

For example, an outer-thermocouple temperature Htop(t) used for prediction of a substrate-edge predicted temperature W'top(t) of the upper temperature monitor is represented by the following Formula 8 on the basis of the rates of interference shown in FIG. 13.

[Formula 8]

$$Htop(t)=\{Hu(t)\times 0.727\}+\{Hcu(t)\times 0.364\}+\{Hcl(t)\times(-0.068)\}+\{Hl(t)\times(-0.023)\} \quad (8)$$

where Hu(t), Hcu(t), Hcl(t), and Hl(t) indicate outer-thermocouple temperatures of the U zone, the CU zone, the CL zone, and the L zone, respectively.

The outer-thermocouple temperature Htop(t) calculated with Formula 8 is substituted into Formula 1 to be used for calculation of an outer predicted temperature HWtop(t) of the upper temperature monitor.

Also, for calculation of outer-thermocouple temperatures H, outer-thermocouple temperatures H of, for example, four temperature adjustment zones may be raised (step-up) one at a time by 5° C., and rates of interference between the respective outer-thermocouple temperatures H and the substrate-edge temperatures W from changes in respective substrate-edge temperatures W of the upper temperature monitor, the lower temperature monitor, and the central temperature monitor.

As described above, inner predicted temperatures PW(t) and outer predicted temperatures HW(t) can be found by calculating inner-thermocouple temperature P and outer-thermocouple temperatures H, which correspond to the upper temperature monitor, the lower temperature monitor, and the central temperature monitor, respectively, from inner-thermocouple temperature P and outer-thermocouple temperatures H of the four temperature adjustment zones, respectively.

Also, in the case where four monitor substrates are provided to correspond to the four temperature adjustment zones, respectively, positions closest to the inner thermocouple 302 and the outer thermocouple 342 in positions, in which the monitor substrates 400, respectively, are arranged, can be calculated by finding a state of interference.

That is, virtual temperature detection means comprising optimum positions of the inner thermocouple 302 and the outer thermocouple 342, which correspond to respective substrates in the respective temperature adjustment zones, can be found by the relationship of interference, and substrate predicted temperatures can be found by the inner thermocouple 302 and the outer thermocouple 342 thus found.

Subsequently, an explanation will be given to the procedure of determining temperature prediction parameters "K1, T1, K2, T2, b, C" for calculation of a substrate-edge predicted temperature W'(t) by way of the procedure for the upper temperature monitor.

Figure 14:
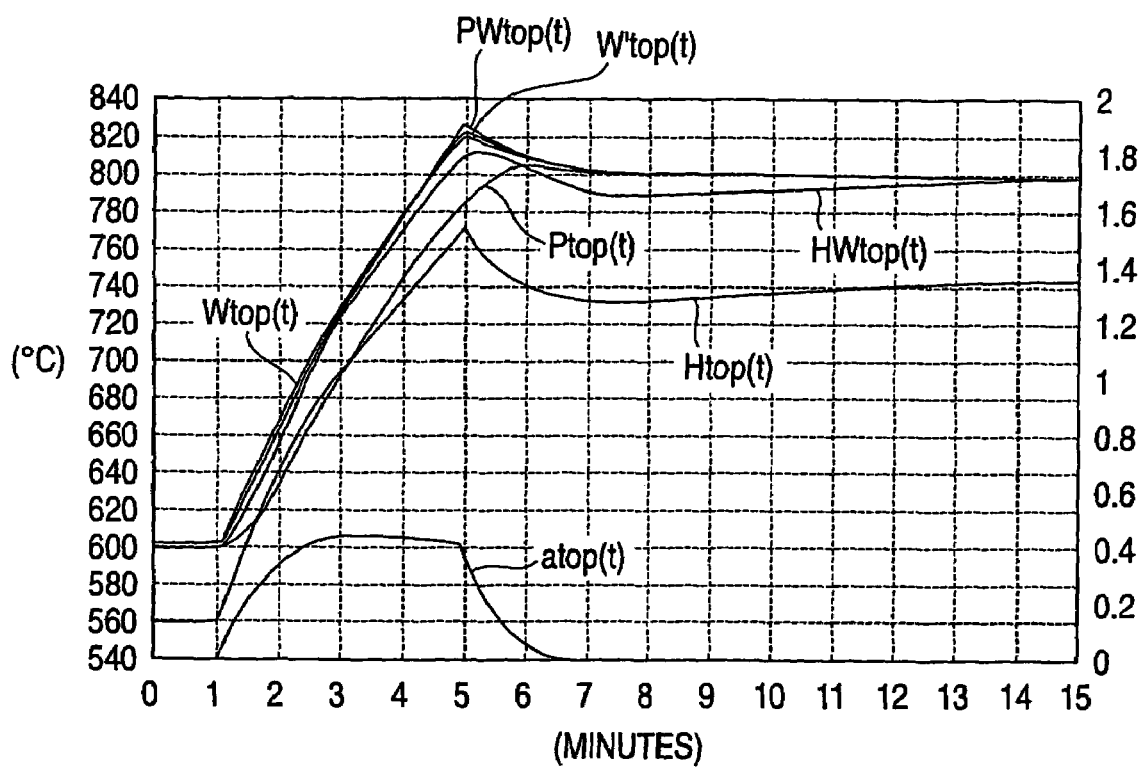
FIG. 14 is a graph illustrating an example of temperature data required for adjustment of a substrate-edge predicted temperature W'top(t) for the upper temperature monitor.

FIG. 14 is a graph illustrating an example of temperature data required for adjustment of a substrate-edge predicted temperature W'top(t) for the upper temperature monitor.

FIG. 14 illustrates, for the upper temperature monitor, an inner-thermocouple temperature Ptop(t) and an outer-thermocouple temperature Htop(t) calculated as described above, an outer predicted temperatures HWtop(t) calculated from the outer-thermocouple temperature Htop(t) by Formula 1, an inner predicted temperature PWtop(t) calculated from the inner-thermocouple temperature Ptop(t) by Formula 4, a weight atop(t) calculated from the inner-thermocouple temperature Ptop(t) by Formula 6, a substrate-edge predicted temperature W'top(t) calculated from these values by Formula 5, and a substrate-edge temperature Wtop detected by the upper temperature monitor, by way of a graph.

An operator adjusts and determines temperature prediction parameters "K1, T1, K2, T2, b, C" sequentially from the gain K1 for the upper temperature monitor, the lower temperature monitor, and the central temperature monitor, respectively, such that the substrate-edge predicted temperature W'top(t) illustrated in FIG. 14 approaches the substrate-edge temperature Wtop.

Therefore, in the case where the temperature prediction parameters "K1, T1, K2, T2, b, C" are to be determined, it is preferable to use a graph illustrating substrate-edge predicted temperatures W'(t) for the upper temperature monitor, the lower temperature monitor, and the central temperature monitor, respectively, in the manner illustrated in FIG. 14.

Figure 15:
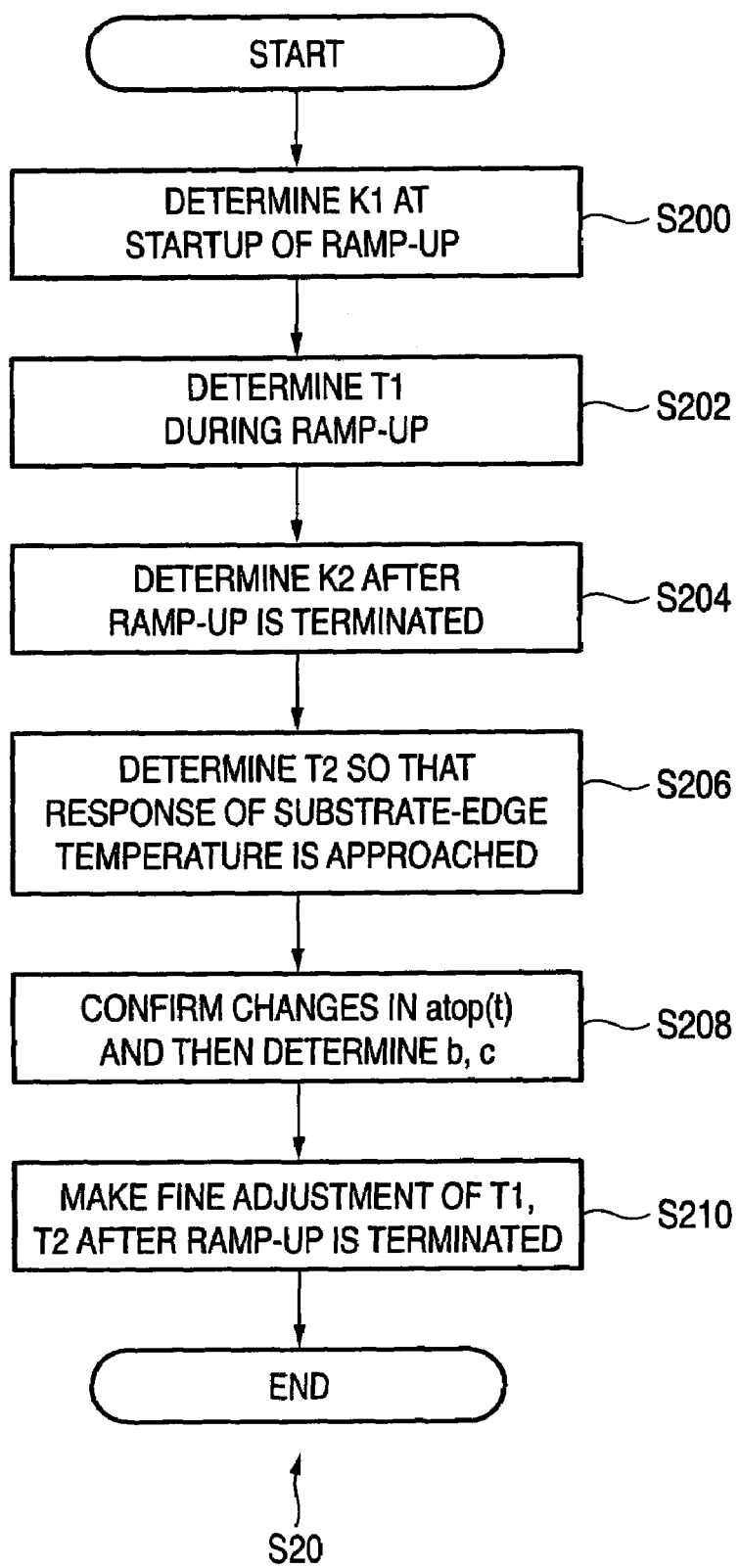
FIG. 15 is a flowchart (S20) illustrating the procedure of determining temperature prediction parameters "K1, T1, K2, T2, b, C".

FIG. 15 is a flowchart (S20) illustrating the procedure of determining the temperature prediction parameters "K1, T1, K2, T2, b, C".

In addition, the procedure of determining a parameter for the upper temperature monitor is experimentarily described for comparison with FIG. 14.

As shown in FIG. 15, an operator determines, in STEP 200 (S200), the gain K1 in Formula 1 from ratios of outer predicted temperatures HWtop(t) to substrate-edge temperatures Wtop at the startup of ramp-up (an interval of 1 to 2 minutes in FIG. 14) illustrated in FIG. 14.

Preferably, a value of the gain K1 is determined so that outer predicted temperatures HWtop(t) are made substantially equal to substrate-edge temperatures Wtop.

in STEP 202 (S202), an operator determines a value of the time constant T1 in Formula 1 so that outer predicted temperatures HWtop(t) during ramp-up (an interval of 1 to 5 minutes in FIG. 14) approach response of the substrate-edge temperatures Wtop as far as possible.

In STEP 204 (S204), an operator determines a value of the gain K2 in Formula 2 so that inner predicted temperatures PWtop(t) are made substantially equal to substrate-edge temperatures Wtop in a state, in which the temperature change of the substrate-edge temperatures Wtop decrease after ramp-up (after the lapse of 10 minutes in FIG. 14).

In this case, the value of the gain K2 is adjusted with an initial value being the value of the gain K1 determined in S200.

In STEP 206 (S206), an operator determines a value of the time constant T2 in Formula 2 so that response of inner predicted temperatures PWtop(t) generally approach response of the substrate-edge temperatures Wtop.

In STEP 208 (S208), an operator confirms changes in the weight atop(t) with the weight gain C being 1.0 and the filter time constant b being 10.

In the case where changes in the weight atop(t) are vibratory, a value of the filter time constant b is determined in the case where the filter time constant b is caused to sequentially change to, for example, 10, 20, 30, 40 and so changes in the weight atop(t) are not vibratory.

In STEP 210 (S210), the time constants T1, T2 are subjected to fine adjustment so that response of the substrate-edge predicted temperature W'top(t) approaches response of the substrate-edge temperature Wtop after the termination of ramp-up (after the lapse of 5 minutes in FIG. 14).

In addition, in order to perform control so that the substrates become at a set temperature early, the parameters are preferably adjusted laying stress on temperature changes in the respective substrates after the termination of ramp-up (after the lapse of 5 minutes in FIG. 14) rather than during ramp-up (an interval of 1 to 5 minutes in FIG. 14).

In the case where there is a large difference of, for example, at least 10° C. between response of the substrate-edge predicted temperature W'top(t) and response of the substrate-edge temperature Wtop even when the temperature prediction parameters are adjusted according to the procedure in S20, the time constants T1, T2 may be further subjected to fine adjustment by changing a value of the weight gain C set in S208 in a manner to sequentially decrease the same to, for example, 0.9, 0.8.

That is, a difference between response of the substrate-edge predicted temperature W' top (t) and response of the substrate-edge predicted temperature Wtop may be decreased by laying stress on the inner predicted temperature PWtop(t) rather than the outer predicted temperature HWtop(t).

Also, in S20, the temperature prediction parameters "K1, T1, K2, T2, b, C" can be likewise determined for the lower monitor substrate 56 and the central monitor substrate 58.

[Substrate-temperature Predictive Control]

The temperature controller 4 predicts substrate temperatures as described above and controls the output of the heater 34 on the basis of control by the device operation part 2 so that substrate temperatures approach a set temperature.

Since the four zone heaters 340-1 to 340-4 are provided for the three temperature monitor substrate 400 of the upper temperature monitor, the lower temperature monitor, and the central temperature monitor in the semiconductor processing equipment 1, the temperature controller 4 controls the outputs of the four zone heaters 340 on the basis of temperature data received from the three temperature monitor substrates 400.

That is, the temperature controller 4 calculates four operating variables in order to control respective outputs of the zone heaters 340-1 to 340-4.

The four operating variables are in some cases calculated with rates (rates of interference), at which, for example, the zone heaters 340-1 to 340-4 interfere with the upper temperature monitor, the lower temperature monitor, and the central temperature monitor and in other cases calculated with results of inversion of interference matrix described later.

First, an explanation is given to the case where the four operating variables are calculated with rates of interference.

In calculating the four operating variables with rates of interference, predicted temperatures for the respective temperature monitor substrates 400 and deviations of the respective temperature monitor substrates 400 relative to set temperatures are allotted to the respective temperature adjustment zones (U, CU, CL, L) in conformity to the rates of interference.

For example, in the rates of interference shown in FIG. 13, in the case where the set temperature is 850° C. and the substrate-edge predicted temperature W'top(t) for the upper temperature monitor is 845° C., a deviation of the substrate-edge predicted temperature W'top(t) relative to the set temperature of the upper temperature monitor is 5° C. (850° C.-845° C.).

Here, quotas of deviation to the respective temperature adjustment zones (U, CU, CL, L) at the substrate-edge predicted temperature W'top(t) are represented by Formula 9-1 to Formula 9-4.

[Formula 9]

$$\text{Quota of deviation to the U zone} = 5° C. \times 0.727 = 3.635° C. \tag{9-1}$$

$$\text{Quota of deviation to the CU zone} = 5° C. \times 0.364 = 1.820° C. \tag{9-2}$$

$$\text{Quota of deviation to the CL zone} = 5° C. \times (-0.068) = -0.340° C. \tag{9-3}$$

$$\text{Quota of deviation to the L zone} = 5° C. \times (-0.023) = -0.115° C. \tag{9-4}$$

The temperature controller 4 calculates quotas of deviation for the lower temperature monitor and the central temperature monitor likewise to find the sum of deviations allotted every temperature adjustment zone.

Then, the temperature controller 4 uses the sum of deviations allotted every temperature adjustment zone to calculate operating variables for the respective zone heaters 340-1 to 340-4 by means of PID calculation to control the outputs of the zone heaters 340-1 to 340-4 so that the sum of deviations allotted every temperature adjustment zone makes zero (0).

Subsequently, an explanation will be given to the case where four operating variables are calculated with results of inversion of an interference matrix.

In order to calculate the operating variables with results of inversion of an interference matrix, the interference matrix is first found.

In the upper temperature monitor, the lower temperature monitor, and the central temperature monitor, respectively, let assume that variation of the substrate-edge temperature W relative to a change of the inner-thermocouple temperature P is the same as a value shown in FIG. 12 when the temperature in the reactor 3 when it becomes flat is set as a standard.

First, for the respective temperature adjustment zones (U, CU, CL, L), variations of the substrate-edge temperatures W of the upper temperature monitor, the lower temperature monitor, and the central temperature monitor are calculated when the set temperatures S change (step-up) 1° C. relative to the inner-thermocouple temperatures P.

That is, variations of the substrate-edge temperatures W in step-up are calculated by dividing values of variations of the respective temperature adjustment zones shown in FIG. 12 by a deviation (5° C.).

FIG. 16 illustrates variations of the substrate-edge temperatures W in step-up in a state, in which row and column in results of calculation described above are replaced by each other.

That is, FIG. 16 is a table illustrating variations of the substrate-edge temperatures W in step-up for the upper temperature monitor, the lower temperature monitor, and the central temperature monitor, respectively.

Since no square matrix is resulted assuming that values illustrated in FIG. 16 constitute a matrix, a virtual upper monitor substrate is virtually provided above the upper temperature monitor as shown in FIG. 17.

That is, FIG. 17 is a table illustrating variations of the substrate-edge temperatures W in step-up for the virtual upper monitor substrate in addition to variations of the substrate-edge temperatures W in step-up illustrated in FIG. 16.

In addition, for the purpose of simplified expression, it is assumed in the virtual upper monitor substrate as virtually provided that when, for example, the U zone is varied 1° C., variation of the virtual upper monitor substrate is varied 1° C. and virtual upper monitor substrates in the other temperature adjustment zones are not varied in temperature.

Also, in the case where the number of the temperature adjustment zones is greater by at least two than the number of the temperature monitor substrates 400, the virtual monitor substrates as virtually provided may be further increased in number to complete the number for the temperature adjustment zones and the temperature monitor substrates 400 to enable constituting a square matrix.

Values illustrated in FIG. 17 are represented as a matrix by Formula 10 and a matrix M is made an interference matrix.

[Formula 10]

$$M = \begin{pmatrix} 1.000 & 0.000 & 0.000 & 0.000 \\ 0.640 & 0.320 & -0.060 & -0.020 \\ -0.060 & 0.280 & 0.800 & -0.080 \\ -0.080 & -0.140 & 0.420 & 0.620 \end{pmatrix} \quad (10)$$

That is, the interference matrix M represents variations of the substrate-edge temperatures W in the upper temperature monitor, the lower temperature monitor, and the central temperature monitor, respectively, in the case where the inner-thermocouple temperatures P of the respective temperature adjustment zones are varied 1° C.

In addition, as described in Paragraph 0060 in another application filed by the applicant of the present application (Japanese Patent Application No. 2001-272218 filed on Sep. 7, 2001), inversion on the basis of the method of least squares with the use of the interference matrix M illustrated in Formula 10 corresponds to calculation of variations of the inner-thermocouple temperatures P for use in varying the substrate-edge temperatures W of the respective temperature monitor substrates 400.

Inversion for calculation of variations of the inner-thermocouple temperatures P is represented by $[M^T \times M]^{-1} \times M^T$ with the use of the interference matrix M (T: transposed matrix).

Results of inversion of the interference matrix M illustrated in Formula 10 are represented Formula 11.

[Formula 11]

$$[M^T \times M]^{-1} \times M^T = \begin{pmatrix} 1.000 & 0.000 & 0.000 & 0.000 \\ -1.922 & 3.033 & 0.165 & 0.119 \\ 0.672 & -0.930 & 1.120 & 0.115 \\ -0.760 & 1.315 & -0.722 & 1.562 \end{pmatrix} \quad (11)$$

where $^T$ indicates a transposed matrix and $^{-1}$ indicates inversion.

Also, variations, which the inner-thermocouple temperatures P of the respective temperature adjustment zones should undergo, are calculated by multiplying results of inversion illustrated in Formula 11 by deviations of the respective temperature monitor substrates 400, respectively.

Formula 12 illustrates results obtained by multiplying results of inversion illustrated in Formula 11 by deviations of the respective temperature monitor substrates 400, respectively.

[Formula 12]

$$\begin{pmatrix} 1.000 & 0.000 & 0.000 & 0.000 \\ -1.922 & 3.033 & 0.165 & 0.119 \\ 0.672 & -0.930 & 1.120 & 0.115 \\ -0.760 & 1.315 & -0.722 & 1.562 \end{pmatrix} \times \begin{pmatrix} 5 \\ 5 \\ 5 \\ 5 \end{pmatrix} = \begin{pmatrix} 5.0 \\ 7.0 \\ 4.9 \\ 7.0 \end{pmatrix} \quad (12)$$

That is, in the case where all deviations of the respective temperature monitor substrates 400 are, for example, 5° C., variations, which the inner-thermocouple temperatures P of the respective inner thermocouples 302-1 to 302-4 should undergo, are 5° C., 7.0° C., 4.9° C., 7.0° C., respectively, as illustrated in Formula 12.

The temperature controller 4 calculates operating variables for the respective zone heaters 340-1 to 340-4 by means of PID calculation to control the outputs of the zone heaters 340-1 to 340-4 so that variations, which the inner-thermocouple temperatures P of the respective inner thermocouples 302-1 to 302-4 should undergo, makes zero (0).

In addition, while an explanation has been given to substrate-temperature predictive control by way of control, in which the substrate-edge temperatures W approach the set temperatures S, the control is not limited thereto but control can be likewise performed in case of performing control so that the substrate-center temperatures C approach the set temperatures S.

When substrates are to be processed, predicted temperatures of the upper monitor substrate 54, the lower monitor substrate 56, and the central monitor substrate 58 are calculated from temperature in the reactor 3, which is detected by the outer thermocouples 342 and the inner thermocouples 302, on the basis of rates of interference of the zone heaters 340-1 to 340-4 or results of inversion of the interference matrix M, and operating variables for the respective zone heaters 340-1 to 340-4 are calculated to control the outputs of the zone heaters 340-1 to 340-4 so that predicted temperatures of the substrates as calculated become consistent with the set temperatures S.

Since the temperature controller 4 periodically controls the outputs of the zone heaters 340-1 to 340-4, it can perform control so that temperatures of the upper monitor substrate 54, the lower monitor substrate 56, and the central monitor substrate 58 are varied according to the set temperatures S.

[Acquisition of Temperature Data Required for Substrate-temperature Predictive Control]

Predicted temperature of the temperature monitor substrate 400 can be calculated by using the outer predicted temperature H and the inner predicted temperature P to perform the first order lag calculation as described above.

It is necessary to adjust the temperature prediction parameters "K1, T1, K2, T2, b, C" every semiconductor processing equipment, which performs temperature control of substrates, before the processing of substrates.

In adjusting the temperature prediction parameters, outer predicted temperatures H and inner predicted temperatures P, which are acquired at the same period as that (control period) when temperature control is performed at the time of processing, are necessary especially in case of adjusting the time constants T1, T2.

Also, in the semiconductor processing equipment 1, that period (control period), in which temperature control is performed through the temperature controller 4, and that period, in which temperature data are displayed or recorded by the display/input unit 22 or the recording output unit 24, are different from each other in the device operation part 2.

For example, after the temperature controller 4 (FIG. 2) receives temperature data through the inner thermocouples 302-1 to 302-4 and the outer thermocouples 342-1 to 342-4, operating variables for the respective zone heaters 340-1 to 340-4, respectively, are calculated and that period (control period), in which electric power values are output to the zone heaters 340-1 to 340-4, takes 0.5 seconds.

On the other hand, that period, in which the operation control unit 20 receives temperature data from the temperature controller 4 through the communication unit 28 to output the same to the display/input unit 22 or the recording output unit 24, in the device operation part 2 takes 4 seconds.

This is because time, which the device operation part 2 and the temperature controller 4 take in communication processing, is saved, the CPU 200 of the device operation part 2 mainly performs the processing of using recipe, and the CPU 40 of the temperature controller 4 can mainly perform the processing of temperature control on substrates.

In this manner, in the case where that period, in which the display/input unit 22 or the recording output unit 24 outputs temperature data, takes 4 seconds and the temperature controller 4 controls temperatures of substrates, takes 0.5 seconds, the display/input unit 22 or the recording output unit 24 must output temperature data in the period of 0.5 seconds in order to adjust the temperature prediction parameters "K1, T1, K2, T2, b, C" for calculation of predicted temperatures.

That is, an operator can obtain the graph illustrated in FIG. 14 by having the recording output unit 24 or the like outputting temperature data in the period of 0.5 seconds.

Temperature data in the period of 0.5 seconds may enable the period changing unit 220 of the device operation part 2 to modify a period of communication between the device operation part 2 and the temperature controller 4 and enable selecting either 4 seconds or 0.5 seconds for a period of temperature data, which an operator acquires from the device operation part 2, for example.

Also, that interpolatory processing, in which temperature data in the period of 0.5 seconds are created from temperature data, which the device operation part 2 acquires in the period of 4 seconds, to be interpolated between temperature data in the period of 4 seconds, may be performed.

Further, the temperature prediction parameters may be adjusted by having that device, which makes an option for the semiconductor processing equipment 1, to create temperature data in the period of 0.5 seconds to perform that interpolatory processing, in which such temperature data are interpolated between temperature data in the period of 4 seconds.

[Input of Parameters Required for Substrate-temperature Predictive Control]

For the substrate-temperature predictive control, an operator must set the temperature prediction parameters "K1, T1, K2, T2, b, C" and parameters for rates of interference or results of inversion of the interference matrix M through the device operation part 2.

For example, the device operation part 2 preferably receives parameters required for substrate-temperature predictive control like parameters when PID control of the inner-thermocouple temperature P to the set temperature S is performed.

Also, parameters required for substrate-temperature predictive control of substrates are adjusted every temperature zone, in which substrates are processed, and set respectively as individual parameter tables preferably.

Further, for the parameter tables, individual parameter tables may be set according to the number of substrates processed in the reactor 3.

For example, the temperature prediction parameters "K1, T1, K2, T2, b, C" for use in placing 100 substrates on the boat 108 to adjust the same, and the temperature prediction parameters "K1, T1, K2, T2, b, C" for use in placing 50 substrates on the boat 108 to adjust the same, respectively, may be set, and parameter tables may be selected through the device operation part 2 according to the number of substrates processed in the reactor 3.

Figure 18:
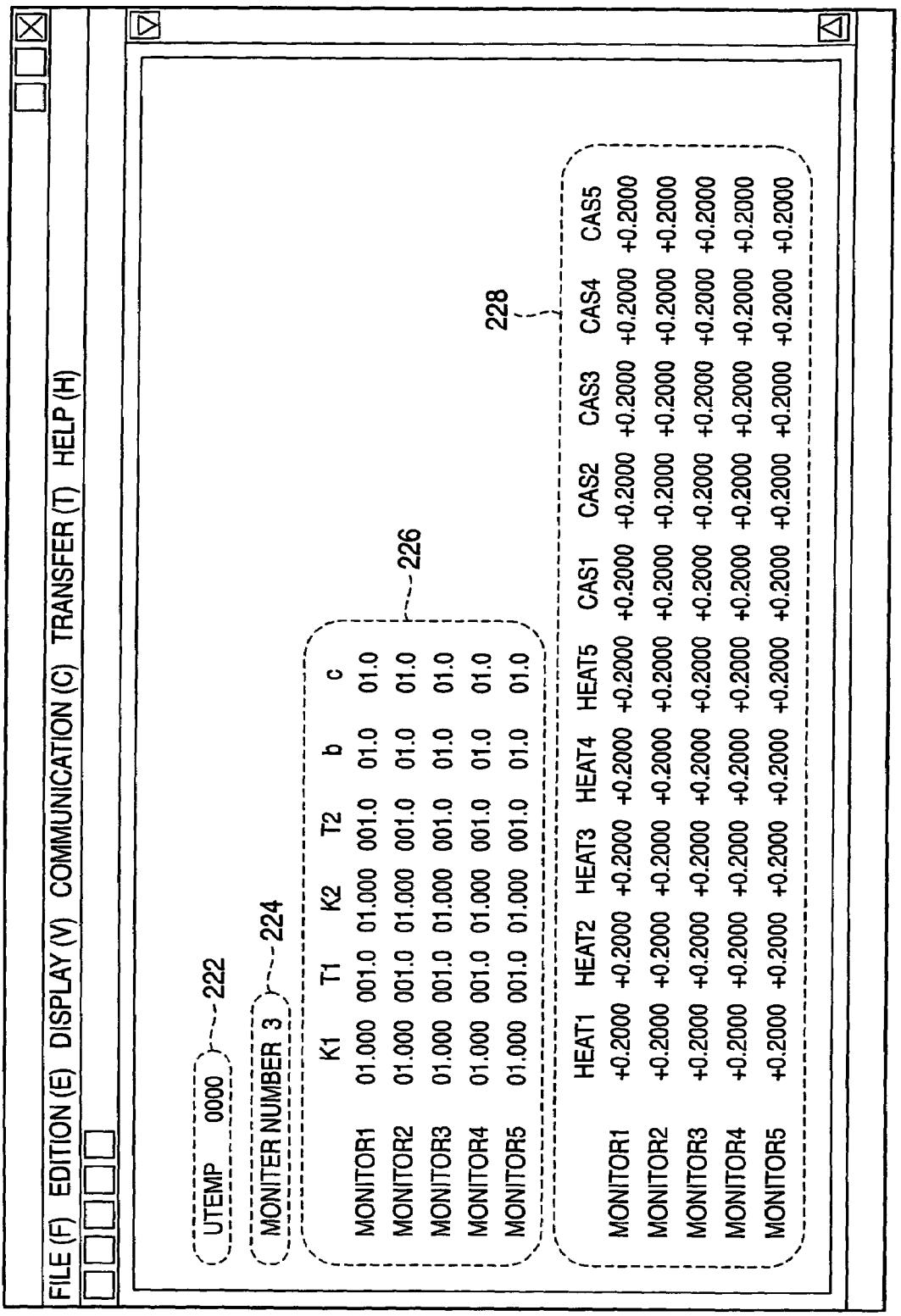
FIG. 18 is a view illustrating a parameter set screen displayed in the case where a display/input unit of the device operation part receives parameters.

FIG. 18 is a view illustrating a parameter set screen displayed in the case where the display/input unit 22 of the device operation part 2 receives parameters.

As shown in FIG. 18, the parameter set screen includes a table selection section 222, a monitor substrate number input section 224, a prediction parameter input section 226, and an interference extent input section 228.

The table selection section 222 receives instructions from an operator to select a parameter table conformed to a temperature zone, in which substrates are processed.

The monitor substrate number input section 224 receives the number of temperature monitor substrates 400 to be used from an operator.

In this manner, more than three temperature monitor substrates 400 may be used in the semiconductor processing equipment 1.

Also, the number of temperature monitor substrates 400 may be one or two.

The prediction parameter input section 226 receives the temperature prediction parameters "K1, T1, K2, T2, b, C" every temperature monitor substrate 400 from an operator.

The interference extent input section 228 receives rates of interference or results of inversion of an interference matrix every temperature monitor substrate 400 for the outer thermocouples 342-1 to 342-4 and the inner thermocouples 302-1 to 302-4, respectively, from an operator.

Also, whether either of parameters of rates of interference or results of inversion of an interference matrix performs control may be displayed in the parameter set screen to afford setting of switchover.

[Execution of Substrate-temperature Predictive Control]

Execution of substrate-temperature predictive control is divided into a step of preparing that substrate-temperature predictive control, in which temperatures are set for the inner thermocouples 302 and the outer thermocouples 342 and temperature changes of temperature monitor substrates 400 are confirmed for determination of temperature prediction parameters, and a step of using the temperature prediction parameters as prepared to perform substrate-temperature predictive control to actually process substrates.

Figure 19:
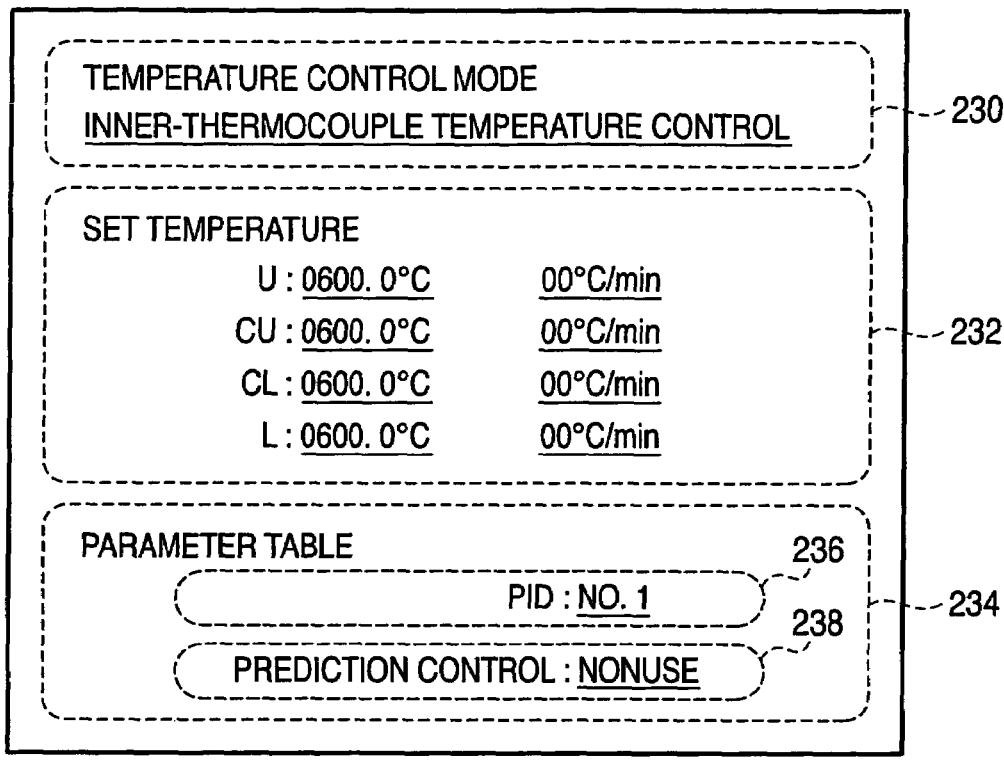
FIG. 19 is a view illustrating an example of a temperature control set screen displayed in the step of preparing a substrate-temperature predictive control, in the display/input unit of the device operation part.
Figure 20:
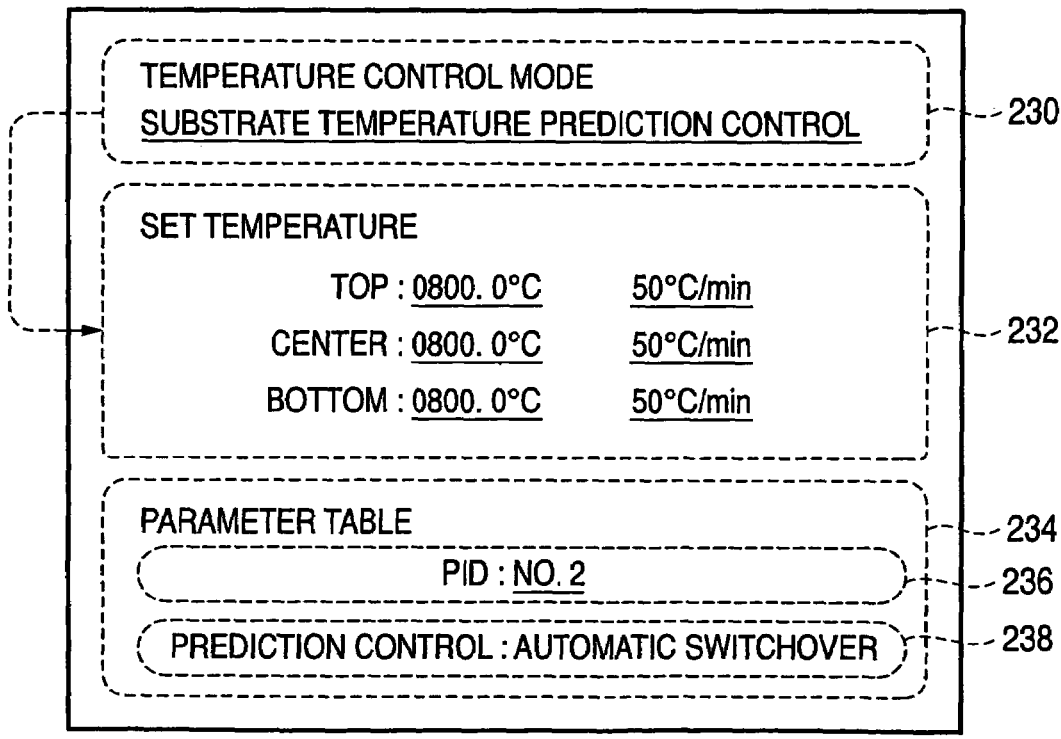
FIG. 20 is a view illustrating an example of a temperature control set screen displayed in the step of executing the substrate-temperature predictive control, in the display/input unit of the device operation part.

FIG. 19 is a view illustrating an example of a temperature control set screen displayed in the step of preparing the substrate-temperature predictive control, in the display/input unit 22 of the device operation part 2. FIG. 20 is a view illustrating an example of a temperature control set screen displayed in the step of executing the substrate-temperature predictive control to process substrates, in the display/input unit 22 of the device operation part 2.

The temperature control set screen is displayed in, for example, a touch panel, includes a mode selection section 230, a temperature set section 232, and a parameter set section 234, and affords displaying and receipt of instructions in combination.

The mode selection section 230 receives instructions to select an object for setting in the temperature control set screen and displays the received instructions.

An object for setting in the temperature control set screen includes, for example, the inner thermocouples 302, the outer thermocouples 342, the temperature monitor substrates 400, etc.

When, for example, the inner thermocouples 302 or the outer thermocouples 342 is selected in the mode selection section 230 (see FIG. 19), the temperature control set screen is put in a mode for preparation of substrate-temperature predictive control and receipt of instructions of set temperatures and inclination of temperature rise every zone for the selected thermocouples is displayed in the temperature set section 232.

Also, when, execution of substrate-temperature predictive control is selected in the mode selection section 230 (see FIG. 20), the temperature control set screen is put in a mode for execution of substrate-temperature predictive control and receipt of instructions of set temperatures and inclination of temperature rise for the respective temperature monitor substrates 400 is displayed in the temperature set section 232.

The temperature set section 232 displays receipt of instructions of set temperatures and inclination of temperature rise according to the mode selected in the mode selection section 230.

Further, the temperature set section 232 displays the received instructions.

The parameter set section 234 comprises a PID selection section 236 and a predictive control selection section 238. According to the set temperatures and the inclination of temperature rise set in the temperature set section 232, the PID selection section 236 receives instructions to select a parameter table including, for example, parameters for PID control, and parameters adjusted according to temperature zones of the set temperatures and the number of substrates being objects for processing, and displays the received instructions.

In the case where the mode for preparation of substrate-temperature predictive control is selected in the mode selection section 230, the predictive control selection section 238 displays non-use of the temperature prediction parameters "K1, T1, K2, T2, b, C".

Also, in the case where the mode for execution of substrate-temperature predictive control is selected in the mode selection section 230, the predictive control selection section 238 displays setting by the temperature set section 232, and automatic changeover of parameters by the operation control unit 20 so that optimum temperature prediction parameters "K1, T1, K2, T2, b, C" according to the number of substrates or the like are selected.

In the both cases, an operator may instruct selection of the temperature prediction parameters "K1, T1, K2, T2, b, C" in the predictive control selection section 238.

In this manner, an operator can select preparation of substrate-temperature predictive control and execution of substrate-temperature predictive control for actual processing of substrates through the device operation part 2.

Also, in case of executing the substrate-temperature predictive control to actually process substrates, the device operation part 2 receives substrate temperatures predicted by the temperature controller 4 to be able to display the same by means of the display/input unit 22 or to store in the storage unit 26, and an operator can confirm the situation of predicted temperatures during or after processing of substrates.

Subsequently, an explanation will be given to temperature changes of substrates in the case where substrate-temperature predictive control is executed.

Figure 21:
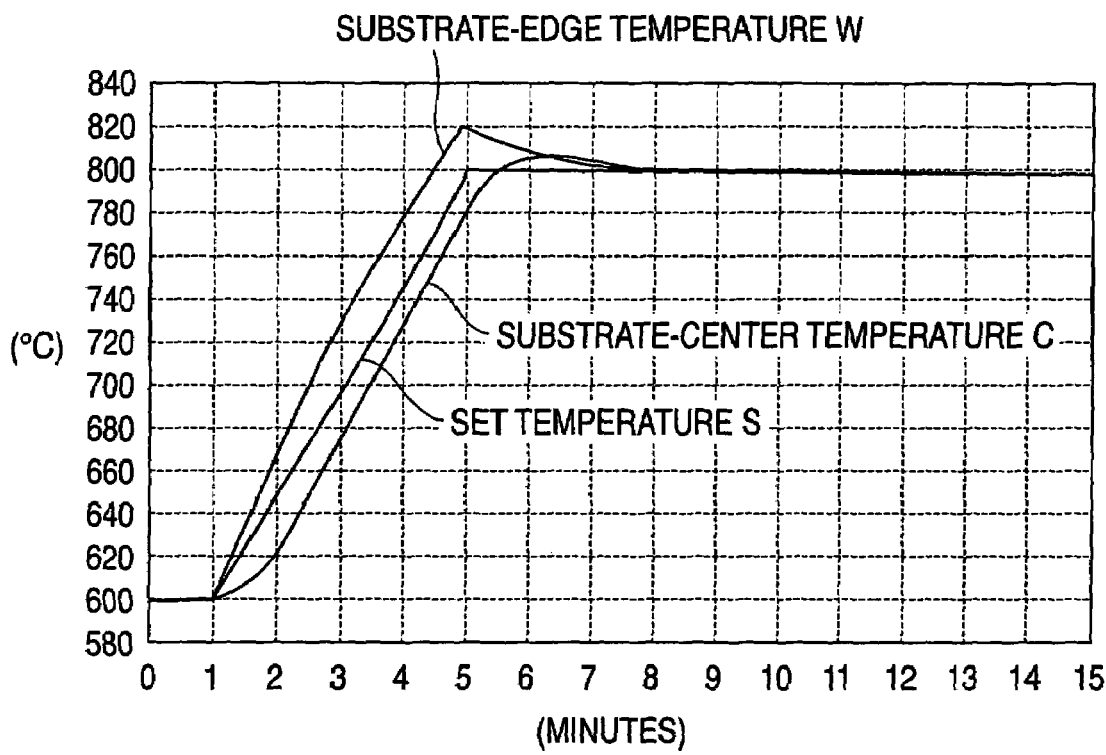
FIG. 21 is a graph illustrating responses of a substrate-edge temperature and a substrate-center temperature in a mode for preparation of substrate-temperature predictive control in the case where the output of a heater is controlled by means of PID calculation so that response of an inner thermocouple approaches changes in a set temperature.

FIG. 21 is a graph illustrating responses of a substrate-edge temperature W and a substrate-center temperatures C in the mode for preparation of substrate-temperature predictive control in the case where the output of the zone heater 340 is controlled by means of PID calculation so that response of an inner thermocouple 302 approaches changes in a set temperature S.

Figure 22:
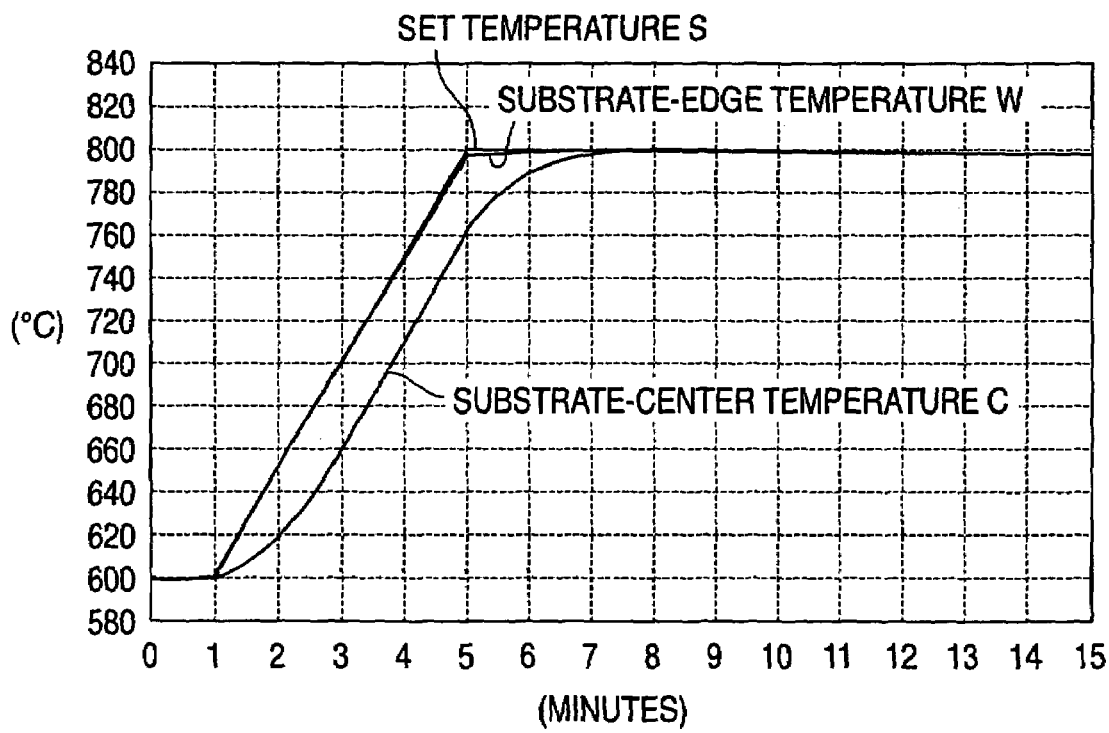
FIG. 22 is a graph illustrating responses of a substrate-edge temperature and a substrate-center temperature relative to changes in a set temperature in a mode for execution of substrate-temperature predictive control where an object of the substrate-temperature predictive control is the substrate-edge temperature.

FIG. 22 is a graph illustrating responses of a substrate-edge temperature W and a substrate-center temperatures C relative to changes in a set temperature S in the mode for execution of substrate-temperature predictive control where an object of the substrate-temperature predictive control is the substrate-edge temperature W.

As shown in FIG. 21, when the temperature controller 4 changes the output of the zone heater 340 by means of PID calculation on the basis of control of the device operation part 2 so that response of temperature of the inner thermocouple 302 approaches changes in the set temperature S, the substrate-edge temperature W and the substrate-center temperatures C, respectively, overshoots much relative to the set temperature S (800° C.) and thereafter become stable at the set temperature S.

On the other hand, as shown in FIG. 22, when substrate-temperature predictive control is executed for changes in the set temperature S where an object of the substrate-temperature predictive control is the substrate-edge temperature W, the substrate-edge temperature W and the substrate-center temperatures C, respectively, become stable at the set temperature S without overshooting the set temperature S much.

In the example illustrated in FIG. 22, since the temperature prediction parameters "K1, T1, K2, T2, b, C" are adjusted so that response of the substrate-edge temperature W through predictive control approaches response of the substrate-edge temperature W detected in the step of preparing the substrate-temperature predictive control, the substrate-edge temperature W reaches and becomes stable at the set temperature S without overshooting the set temperature S and the substrate-center temperatures C rises later in temperature and reaches and becomes stable at the set temperature S later than the substrate-edge temperature W.

Figure 23:
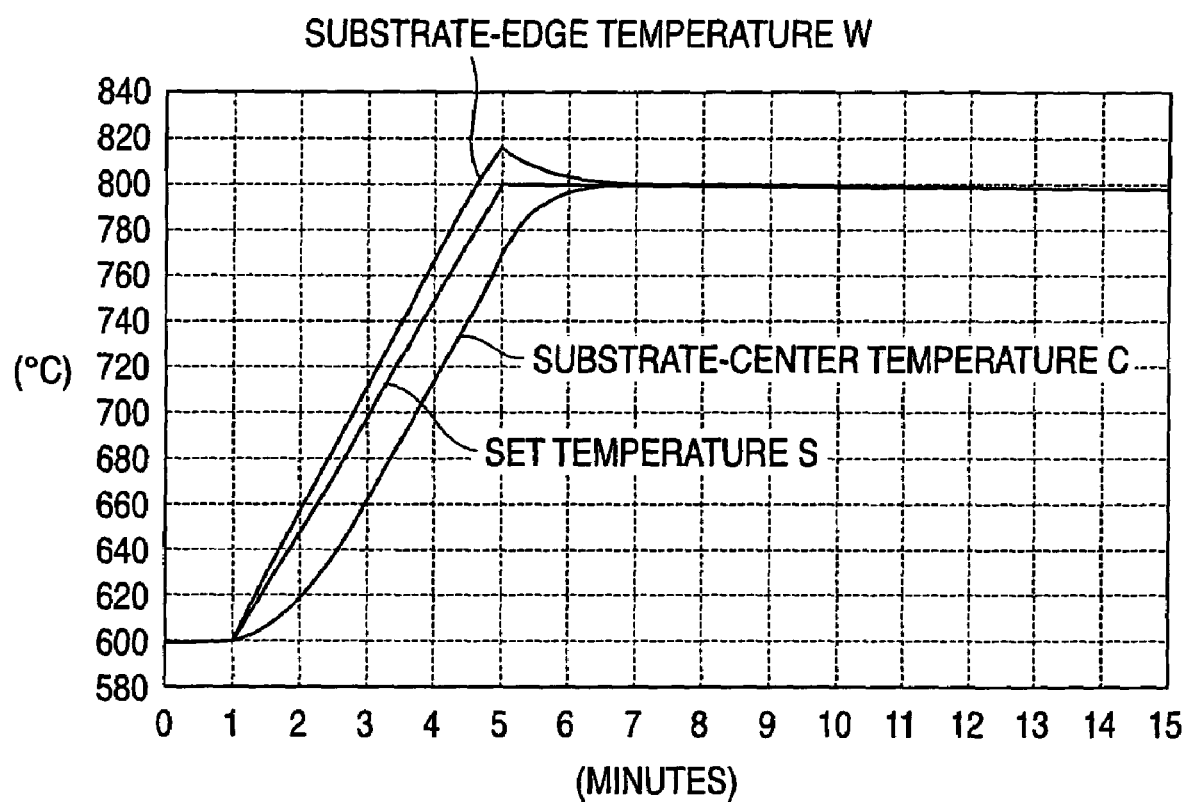
FIG. 23 is a graph illustrating responses of a substrate-edge temperature and a substrate-center temperature relative to changes in a set temperature in the mode for execution of substrate-temperature predictive control where an object of the substrate-temperature predictive control is an average of the substrate-edge temperature and the substrate-center temperature.

FIG. 23 is a graph illustrating responses of a substrate-edge temperature W and a substrate-center temperatures C relative to changes in a set temperature S in the mode for execution of substrate-temperature predictive control where an object of the substrate-temperature predictive control is an average of the substrate-edge temperature W and the substrate-center temperatures C.

As shown in FIG. 23, since the temperature prediction parameters "K1, T1, K2, T2, b, C" are adjusted so that response of that average of the substrate-edge temperature W and the substrate-center temperatures C, which is an object of the substrate-temperature predictive control, through predictive control approaches response of that average of the substrate-edge temperature W and the substrate-center temperatures C, which is detected in the step of preparing the substrate-temperature predictive control, response of the substrate-edge temperature W overshoots the set temperature S less than response of the substrate-edge temperature W shown in FIG. 21 and response of the substrate-center temperatures C reaches and becomes stable at the set temperature S around 1 minute earlier than response of the substrate-center temperatures C shown in FIG. 22.

An object of the substrate-temperature predictive control may be a substrate-center temperatures C or an average temperature of outer peripheral thermocouples 406-1 to 406-4, inner peripheral thermocouples 404-1 to 404-4, and a central thermocouple 402.

In this manner, response of substrate temperatures can be varied on the basis of an object of the substrate-temperature predictive control by freely selecting an object of the substrate-temperature predictive control and adjusting the temperature prediction parameters "K1, T1, K2, T2, b, C" so that response of a predicted temperature of a selected object approaches response of temperature detected in the step of preparing the selected object.

Also, a predicted temperature of the temperature monitor substrate 400 may be calculated by the first-order lag calculation of the inner-thermocouple temperature P and substrate temperatures without the use of the outer-thermocouple temperature H.

In addition, the invention is not limited to the embodiments described above, but it goes without saying that the invention is susceptible to various modifications within a range not departing from the gist thereof.

While the embodiments have been described with respect to a low-pressure CVD device of a batch type semiconductor processing equipment, the invention is not limited thereto but applicable to a thermal treatment equipment such as dispersion equipment or the like in a batch type semiconductor processing equipment, a sheet-fed equipment, and other general substrate processing equipments.

INDUSTRIAL APPLICABILITY

The invention is usable for processing of substrates.

The invention claimed is:

1. A substrate processing equipment comprising
heating means that heats a substrate accommodated in a processing chamber,
first temperature detection means that detects temperature in the neighborhood of the heating means,
second temperature detection means that detects temperature in the neighborhood of the substrate, and
control means that mixes a first predicted temperature of the substrate calculated from the temperature detected by the first temperature detection means and a second predicted temperature of the substrate calculated from the temperature detected by the second temperature detection means, varying a mixing ratio of the first predicted temperature and the second predicted temperature of the substrate according to a magnitude of variation of temperature detected by the second temperature detection means to control the heating means with the use of the first and second predicted temperatures as mixed.

2. The substrate processing equipment according to claim 1, wherein the heating means comprises a plurality of zone heating means,
the temperature detection means comprises first zone-temperature detection means and second zone-temperature detection means, which correspond to the zone heating means, respectively, and
the control means sets virtual temperature detection means in a position nearer to a substrate, a temperature of which is to be predicted, than to other substrates, calculates a detection value of the virtual temperature detection means on the basis of a corresponding relationship between the virtual temperature detection means and the first zone-temperature detection means or the second zone-temperature detection means and a measured value measured by the first zone-temperature detection means or the second zone-temperature detection means, predicts a substrate temperature in a period subsequent to a previous period by means of the first and second predicted temperatures and a substrate temperature in the previous period, which is predicted by the virtual temperature detection means, and controls the respective zone heating means on the basis of the substrate predicted temperature.

3. The substrate processing equipment according to claim 1, further comprising output means that outputs a temperature detected by the first or second temperature detection means in substantially a same period as a period in which the control means controls output of the heating means, by displaying and recording or either of the first or second detected temperatures.

4. A substrate processing method for a substrate processing equipment comprising a reaction chamber that processes a substrate, heating means that heats an interior of the reaction chamber, control means that controls the heating means, first temperature detection means that detects temperature between the heating means and the substrate, and second temperature detection means that detects temperature nearer to the substrate than the first temperature detection means, the method comprising the steps of:

measuring a temperature with the first temperature detection means, calculating a first substrate predicted temperature from the temperature measured by the first temperature detection means, measuring a temperature with the second temperature detection means, calculating a second substrate predicted temperature from the temperature measured by the second temperature detection means, and mixing the first substrate predicted temperature and the second substrate predicted temperature, varying a mixing ratio of the first predicted temperature and the second predicted temperature of the substrate according to a magnitude of variation of temperature detected by the second temperature detection means to control the heating means with the use of the first and second predicted temperatures as mixed.

5. A substrate processing equipment comprising
a heater that heats a substrate accommodated in a processing chamber,
a first thermocouple that detects temperature in the neighborhood of the heater,
a second thermocouple that detects temperature in the neighborhood of the substrate, and
a controller that mixes a first predicted temperature of the substrate calculated from the temperature detected by the first thermocouple and a second predicted temperature of the substrate calculated from the temperature detected by the second thermocouple, varying a mixing ratio of the first predicted temperature and the second predicted temperature of the substrate according to a magnitude of variation of temperature detected by the second thermocouple to control the heater with the use of the first and second predicted temperatures as mixed.

6. A substrate processing method for a substrate processing equipment comprising a reaction chamber that processes a substrate, a heater that heats an interior of the reaction chamber a controller that controls the heater a first thermocouple that detects temperature between the heater and the substrate and a second thermocouple that detects temperature nearer to the substrate than the first thermocouple, the method comprising the steps of:

measuring a temperature with the first thermocouple;

calculating a first substrate predicted temperature from the temperature measured by the first thermocouple;

measuring a temperature with the second thermocouple;

calculating a second substrate predicted temperature from the temperature measured by the second thermocouple; and mixing the first substrate predicted temperature and the second substrate predicted temperature, varying a mixing ratio of the first predicted temperature and the second predicted temperature of the substrate according to a magnitude of variation of temperature detected by the second thermocouple to control the heater with the use of the first and second predicted temperatures as mixed.

* * * * *